US006331791B1

(12) United States Patent
Huang

(10) Patent No.: US 6,331,791 B1
(45) Date of Patent: Dec. 18, 2001

(54) CHARGE-REDISTRIBUTION LOW-SWING DIFFERENTIAL LOGIC CIRCUIT

(75) Inventor: Hong-Yi Huang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/679,847

(22) Filed: Oct. 5, 2000

(30) Foreign Application Priority Data

Oct. 6, 1999 (TW) ................................. 088117197

(51) Int. Cl.[7] .............................................. H03K 19/096
(52) U.S. Cl. ............................. 326/98; 326/98; 326/95; 326/86; 326/83; 327/55; 327/57; 365/205
(58) Field of Search ..................... 326/93, 95, 98, 326/83, 86; 327/51–57; 365/205, 207, 208

(56) References Cited

U.S. PATENT DOCUMENTS

| 4,570,084 | | 2/1986 | Griffin et al. . | |
|---|---|---|---|---|
| 4,843,264 | | 6/1989 | Galbraith . | |
| 4,910,713 | | 3/1990 | Madden et al. . | |
| 5,815,006 | * | 9/1998 | Huang | 326/98 |
| 5,841,298 | * | 11/1998 | Huang | 326/97 |
| 5,859,548 | * | 1/1999 | Kong | 326/113 |
| 6,002,270 | * | 12/1999 | Timoc | 326/98 |
| 6,204,697 | * | 3/2001 | Zerbe | 326/98 |

OTHER PUBLICATIONS

Matsui, M. et al., IEEE Journal of Solid–State Circuits, Vo. 29, No. 12, Dec. 1994.
Takahashi, O. et al., 1998 Symposium on VLSI Circuits Digest of Technical Papers, pp. 110–111.
Hiraki, M. et al., IEEE Journal of Solid State Circuits, vol. 30, No. 4, Apr. 1995.

* cited by examiner

*Primary Examiner*—Michael Tokar
*Assistant Examiner*—Vibol Tran
(74) *Attorney, Agent, or Firm*—Darby & Darby

(57) ABSTRACT

A charge-redistribution low-swing differential logic circuit combining a differential logic network and a charge-redistribution circuit so as to provide a pair of complementary signals having only a small difference, thereby avoiding a time delay. Further, after a sense amplifier is used to amplify the signals, the resulting signals are outputted to sequential differential logic network, wherein the output swing can be reduced by a threshold voltage $V_{tn}$ ($V_{tp}$) on a transistor. In addition, a pipeline is formed by the series connection structure controlled by a true-single-phase clock or by pseudo-single-phase clock, thereby achieving a designed circuit having high-speed and low power dissipation.

15 Claims, 19 Drawing Sheets first A block circuit first B block circuit second A block circuit second B block circuit third A block circuit third B block circuit fourth A block circuit fourth B block circuit

CHARGE-REDISTRIBUTION LOW-SWING DIFFERENTIAL LOGIC CIRCUIT

BACKGROUND OF THE INVENTION

1. Field of the Invention

The present invention relates to a differential logic circuit, and more particularly to a charge-redistribution low-swing differential logic circuit.

2. Description of the Related Art

For a current logic system, especially in design for a complicated high-speed circuit, a differential logic circuit is adopted in order to achieve both true signal and its complementary signal. For example, as shown in FIG. 1, in U.S. Pat. No. 4,570,084, this logic system comprises logic networks 10 and 12 each acting as a switch so that when logic network 10 is closed, logic network 12 is open. Input signal INPUTS and its complementary signal COMPLEMENTARY INPUTS are applied to logic networks 10 and 12, respectively, for controlling its switching operation in networks 10 and 12. Network 10 is connected between an output node 14 and a NMOS pull down transistor 16 connected to ground. Network 12 is connected between an output node 18 and a NMOS pull down transistor 20 connected to ground. A clock pulse $\phi_c$ is applied to the control of whether or not the transistors 16 and 20 are active.

A load circuit 22 comprises PMOS transistors 24 and 26 connected between a source of potential Vdd and output node 14, and PMOS transistors 28 and 30 connected between source Vdd and output node 18. An inverter 32 is connected between an output Q and output node 14. An inverter 34 is connected between a complementary output terminal $\overline{Q}$ of terminal Q and output node 18. Also, clock$\phi_c$ is applied to the control of whether or not the transistors 24 and 28 are active.

In the operation of precharging and equalizing, clock$\phi_c$ is at a potential level of logic 0. This turns off NMOS transistors 16 and 20 and turns on PMOS transistors 24 and 28. Therefore output node 14 and 18 are precharged to source Vdd. At this time, both output terminals Q and $\overline{Q}$ are at logic 0 level through corresponding inverters 32 and 34. As a result, PMOS transistors 26 and 30 are turned on in order to maintain the conductive state.

In the operation of evaluating the information provided by the complementary input signals INPUTS and COMPLEMENTARY INPUTS of its associated logic networks 10 and 12, clock$\phi_c$ is at a potential level of logic 1. This turns on NMOS transistors 16 and 20 and turns off PMOS transistors 24 and 28. Because network 10 is closed, output node 14 is effectively grounded. Because network 12 is open, output node 18 is prevented from discharging so as to maintain at logic 1 level. At this time, output terminal Q is at logic 1 level through inverter 32 and output terminal $\overline{Q}$ is at logic 0 level through inverter 34. As a result, PMOS transistor 26 is maintained in an off condition, and PMOS transistor 30 is maintained in an on condition.

In the foregoing conventional art, the complementary output signal pair are obtained by the differential logic circuit at the same time; additionally, its full swing is from source Vdd to ground Vss.

In current SRAM or DRAM applications, a sense amplifier is often used to detect and amplify an input signal pair; for example an input signal pair from a bit line and its complementary bit line, which have a slight voltage difference, such as a difference of about 100 mV.

Hereinafter, the schematic diagrams of FIG. 2 through FIG. 6 are used to depict the corresponding prior art applications.

Referring to FIG. 2A, as described in U.S. Pat. No. 4,843,264, a sense amplifier is used to rapidly amplify the difference between input signal IN and its complementary input signal INB. In the configuration of FIG. 2A, input signal pair IN and INB are coupled to two NMOS sensing transistors M5 and M6. A latch is formed by two cross coupled CMOS inverters M1–M3 and M2–M4, wherein a common gate input G1 of M2 and M4 are coupled to node n1, which is formed by the source-drain series connection of M1 and M3, thereby providing a complementary output signal OUTB. Likewise, a common gate input G2 of M1 and M3 are coupled to node n2 which is formed by the source-drain series connection of M2 and M4, thereby providing an output signal OUT. Nodes n3 and n4 couple the sources of the NMOS pull down transistors M3 and M4 to the drains of the NMOS sensing transistors M5 and M6, respectively. Pull down transistor M7 is activated when sensing is to be performed.

Referring to FIG. 2B, a sense amplifier combining with precharging and equalizing circuitry is illustrated. During precharging, since PMOS transistors M13, M14, and M17 constitute a precharge circuit and equalizing signal EQB is at logic 0 level, transistors M13, M14, and M17 are turned on, which will consequently activate nodes n1, n2 being precharged by equalizing signal EQB to Vdd and so equalized. Likewise, PMOS transistors M18, M19, and M20 also constitute a precharge circuit, therefore nodes n3, n4 are precharged by equalizing signal EQB to Vdd and so equalized. Further, during sensing, equalizing signal EQB is at logic 1 level, which will consequently disable two precharge circuits, then transistor M7 is turned on by control signal SE to pull down the potential on node n5. Assume that the voltage on signal IN is 100 mV higher than the voltage on signal INB, thereby producing a current difference between transistor M5 and transistor M6. The gate-to-source voltage of transistor M5 is higher than that of transistor M6. As a result, when sensing begins, node n3 will begin pulling down sooner than n4, and thus node n1 will be pulled down faster than n2. Therefore, the potential on node 4 is higher compared to node 3, and the potential on node 1 is lower compared to node 2. Thus, transistor M4 is less conductive than transistor M3 because the gate-to-source voltage on M4 (not shown in figure) will be decreased relative to the gate-to-source voltage on M3. The voltage on node n2 will quickly rise back towards Vdd (OUT) with transistor M4 beginning to shut down. Finally, the relatively high voltage on node n2 will keep transistor M1 off reinforcing the rate at which node n1 is pulled down to Vss (OUTB).

Accordingly, only a small voltage difference is required for detecting an input signal pair. For example, as the voltage on signal IN is 100 mV higher than the voltage on signal INB, two cross coupled CMOS inverters M1–M3 and M2–M4, which form a latch, will rapidly amplify the signal differential between signal IN and INB, and to thereby latch the sensed voltages into nodes n1 and n2 as signals Vss and Vdd, where nodes n1 and n2 constitute a complementary signal pair labeled OUTB and OUT.

Moreover, because one of the two devices on each of the latch (two cross coupled CMOS inverters M1–M3 and M2–M4) will be off, either the pull up transistor (M1 or M2) or the pull down transistor (M3 or M4) will be off on each side of the latch. Thus, after the same amplifier has latched, it consumes no d.c. power. The foregoing techniques provide the advantages of low power consumption, high speed operation, and sense amplifier outputting full swing from power Vdd to ground Vss.

Referring to FIG. 3A, which is another sense amplifier 9 as described in U.S. Pat. No. 4,910,713. Comparing sense amplifier 9 of FIG. 3A to the one in FIG. 2A, the main difference of both is that two sensing transistors exchange the positions with two lower NMOS transistors of the latch.

An input signal pair 15,17 of a sense amplifier 9 are coupled to NMOS sensing transistors N4 and N5. A latch is formed by two cross-coupled CMOS inverters 11,13. Inverter 11 with a common gate input G1 comprises a PMOS pull up transistor P2 and a NMOS pull down transistor N1 both coupled in series by a NMOS sensing transistor N4. The common gate input G1 of inverter 11 is coupled to an output node 25, which is a series connection point of source-to-drain electrode of PMOS transistor P3 and NMOS transistor N5, thereby providing output signal 23. Likewise, inverter 13 with a common gate input G2 comprises a PMOS pull up transistor P3 and a NMOS pull down transistor N2 both coupled in series by a NMOS sensing transistor N5. The common gate input G2 of inverter 13 is coupled to a complementary output node 27 which is a series connection point of source-to-drain electrode of PMOS transistor P2 and NMOS transistor N4, thereby providing output signal 21.

In addition, inverters 11,13 are coupled respectively to source Vdd and ground Vss by the coupling transistors P1, P4, and N3. Two PMOS pull up transistors P2, P3 couple transistors P1, P4 in parallel, respectively. NMOS coupling transistor N3 is coupled between ground Vss and two inverters 11 and 13 in series. During sensing operations, the gates of all three of the coupling transistors P1, P4, and N3 are connected together and are strobed by a control signal AMP STROBE on the line 29, i.e., during non-sensing operation, a low potential of the signal AMP STROBE on the line 29 will deactivate or electrically isolate the latching pairs of two cross coupled CMOS inverters 11,13, whereas, during sensing operation, a high potential of the signal AMP STROBE on the line 29 will activate the latching pairs of two cross coupled CMOS inverters 11,13.

During sensing operation, when NMOS coupling transistor N3 is activated under a high potential of the signal AMP STROBE on the line 29 and is therefore to be pulled down to ground Vss, PMOS coupling transistors P1 and P4 are then simultaneously disabled making the sensing operation perform the same as the processes in FIG. 2A. Meanwhile, only the voltage difference of input signal pair 15,17 is amplified and appeared on the corresponding output nodes 25 and 27.

During non-sensing operation, when NMOS coupling transistor N3 is deactivated under a low potential of the signal AMP STROBE on the line 29, PMOS coupling transistors P1 and P4 are then simultaneously active. Therefore the output nodes 25 and 27 corresponding to the cross coupled CMOS inverters 11 and 13 are pulled up to source Vdd, and no Vdd-to-Vss path and drain current exist through the CMOS inverters 11 and 13, thereby avoiding power dissipation.

Referring to FIG. 3B, an alternate embodiment is illustrated. An input signal pair 15', 17' of a sense amplifier 9' are coupled to PMOS sensing transistors P11, P12. A latch is formed by two cross-coupled CMOS inverters 11' and 13' which are coupled to transistors P11 and P12, respectively. Inverter 11' with a common gate input G1' comprises a NMOS pull up transistor N16 and a PMOS pull down transistor P13. The common gate input G1' of inverter 11' is coupled to an output node 25', which is a series connection point of the source-to-drain electrode of NMOS transistor N17 and PMOS transistor P14 of inverter 13', thereby providing output signal 23'. Inverter 13' with a common gate input G2' comprises a NMOS pull up transistor N17 and a PMOS pull down transistor P14. The common gate input G2' of inverter 13' is coupled to an output node 27', which is a series connection point of the source-to-drain electrode of NMOS transistor N16 and PMOS transistor P13 of inverter 11', thereby providing complementary output signal 21'.

In addition, inverters 11', 13' are coupled respectively to source Vdd and ground Vss by the coupling transistors N15, N18, and P10. NMOS transistor N16 of inverter 11' and NMOS transistor N17 of inverter 13' are coupled to transistors N15 and N18 in parallel, respectively. PMOS coupling transistor P10 is coupled between source Vdd and two inverters 11' and 13' in series. During sensing operations, the gates of all three of the coupling transistors N15, N18, and P10 are connected together and are strobed by a control signal 31, i.e., during non-sensing operation, a high potential of the control signal 31 will deactivate or electrically isolate the latching pairs of two cross coupled CMOS inverters 11', 13', whereas, during sensing operation, a low potential of the control signal 31 will activate the latching pairs of two cross coupled CMOS inverters 11', 13'.

As noted above, during sensing operation, when PMOS coupling transistor P10 is activated under a low potential of the control signal 31 and is therefore to be pulled up to source Vdd, NMOS coupling transistors N15 and N18 are then simultaneously disabled making the sensing operation perform the same as the processes in FIG. 2A. Meanwhile, only the voltage difference of input signal pair 15,17 is amplified and sequentially appearing on the corresponding output nodes 25 and 27.

During non-sensing operation, when PMOS coupling transistor P10 is deactivated under a high potential of the control signal 31, NMOS coupling transistors N15 and N18 are then simultaneously active. Therefore the output nodes 25' and 27' corresponding to the cross coupled CMOS inverters 11' and 13' are pulled down to ground Vss, and no Vdd-to-Vss path and drain current exists through the CMOS inverters 11' and 13', thereby avoiding power dissipation.

In the conventional sensing operation as described above, when a pair of input signals are amplified up to full swing from the potential of power source to the potential of ground, the sensing amplifier will output the corresponding output pair of input signal pair. Therefore, when the delay time for pulling up from the potential of power source to the potential of ground is longer, this design will not work well for a high-speed device such as a memory. To improve the above, an alternate conventional technique is applied, wherein the sense amplifier will output the correspondingly resulting signal pair as soon as the input signal pair is amplified up to an acceptable level having a small difference between input signals.

Referring to FIGS. 4A and 4B, in the article in "IEEE JOURNAL OF SOLID-STATE CIRCUITS, VOL. 29, NO. 12. DECEMBER 1994" by Mastaka Matsui etc., there is disclosed an alternate sensing-amplifying technique. The sensing-amplifying technique combines NMOS dynamic differential logic network, for example, DPTL (differential pass transistor logic) or CPL (complementary pass transistor), with SA-FF (sense amplifying pipeline flip-flop circuit), wherein the basic concept of SA-FF is that a sense amplifier is merged into a latch which is synchronous to system clock CLK. SA-FF amplifies low-swing differential ($\Delta$Vin) inputs D, $\overline{D}$. Here, Q, $\overline{Q}$ are the full-swing outputs of SA-FF. In this case, there is no need of additional inverter to generate a local clock with the opposite polarity because SA-FF can be operated in the control of a true single-phase clock.

In an operating manner, combinational logic mainly outputs the signals A, B to an NMOS differential logic network. Differential inputs D, $\overline{D}$ are generated from the NMOS differential logic network controlled by a φp pulse. The differential inputs D, $\overline{D}$ are pre-discharged to ground while pulse φp is active at logic 1 potential in a pre-discharging state. The foregoing outputs Q, $\overline{Q}$ of SA-FF latch the result last time while complementary system clock $\overline{CLK}$ is at logic 1 potential; pulse φp is at logic 0 potential for evaluation of the logic network, therefore NMOS differential logic network has the outputs with a difference ΔVin (about 100 mV) from inputs D, $\overline{D}$. At this time, as soon as clock $\overline{CLK}$ transits from logic 1 to the falling edge of logic 0, SA-FF is activated immediately without waiting for the difference ΔVin further developed and performs the sense-amplified and latch operation for inputs, thereby obtaining a complementary pair of differential outputs Q, $\overline{Q}$. Alternately, during clock $\overline{CLK}$ remaining on logic 0 potential, the difference ΔVin is further developed. Because only NMOS logic is adopted, the full-swing of inputs D, $\overline{D}$ is the difference Vdd-Vtn between Vss-to-Vdd (not shown) and NMOS transistor threshold voltage Vtn (about 700 mV).

NMOS differential logic is mainly used in the circuit mentioned above. With the circuit of pre-discharging to ground during non-sensing, one of input signals D, $\overline{D}$ will be pulled up from ground to the difference Vdd-Vtn between source Vdd and NMOS transistor threshold voltage Vtn. Also, when the difference ΔVin of inputs D, $\overline{D}$ is a small value (about 100 mV), SA-FF is active immediately and performs the sense-amplified and latch operation, thereby obtaining a complementary output pair Q, $\overline{Q}$. But, it is disadvantageous in a low-frequency device for one of inputs D, $\overline{D}$ to be pulled up continually from Vss to Vdd-Vtn when pulse φp remains on logic 0 potential for a long time, thereby suffering from high power dissipation.

Referring to FIG. 5, in the article in "1998 Symposium on VLSI Circuits Digest of Technical Papers", there is disclosed a sense-amplifier SA combined with isolated transistors I1, I2, wherein the sense-amplifier SA comprises cross-coupled CMOS inverters M41, M42, M43, M44, and NMOS pull down transistor M45.

During non-sensing, bit line BL and its complementary bit line $\overline{BL}$ is charged to source potential. Meanwhile, isolated signal ISO is at logic 0 potential, therefore isolated transistors I1, I2 are turned on, and nodes A1', A2' are charged to a source potential. During sensing, one of the complementary bit line pair BL, $\overline{BL}$ will be pulled down so that the voltage difference is developed to a constant difference such as 100 mV. Also, one of nodes A1', A2' will therefore be pulled down. Sequentially, isolated signal ISO is at logic 1 potential, therefore nodes A1', A2' are isolated due to isolated transistors I1, I2. The sense-amplifier is enabled after pull down transistor M45 is active under signal SET at logic 1 potential. As a result, the output terminal of NAND gate A1 on the side of the complementary bit line $\overline{BL}$ outputs a true signal, and the output terminal of NAND gate A2 on the side of the bit line BL outputs the true signal complement.

Namely, during sensing operation, one of the input signal pair will be pulled down to ground as mainly mentioned above. Then, input terminals BL, $\overline{BL}$ as soon as they have only a small difference such as 100 mV, are isolated by transistors I1, I2 and immediately sense-amplified and latched by the sense-amplifier, thereby obtaining a complementary differential output pair. However, it is disadvantageous when the power is continuously dissipated by pulling down one of input signal pair BL, $\overline{BL}$ from source to ground.

In addition, referring to 6A–6B, in the article in "IEEE JOURNAL OF SOLID-STATE CIRCUITS, VOL. 30, NO. 4. APRIL 1995" by Mitsuru Hiraki etc., there is disclosed a DDL bus (data-dependent logic bus) technique, which reduces its voltage swing using charge sharing between bus wires and an additional bus wire such as a dummy ground wire. First, according to a conventional n-bit bus of FIG. 6A, the voltage swing of bus signals coincides with the supply voltage Vdd. Thus, the bus power dissipation P required to switch n bits of the bus signals is given by:

$$P = n * f * Cw * V^2 dd$$

where f and Cw are the switching frequency and wiring capacitance.

According to a n-bit bus signals of FIG. 6B, after adding a dummy ground bus wire (which is grounded at initial, then floated), the voltage swing of DDL bus wires based on n-bit charge sharing is reduced to Vdd/n+1, and the bus power dissipation required to switch the n-bit bus signals is reduced to P':

$$P' = [(n)/(n+1)] * f * Cw * V^2 dd$$

In the foregoing conventional scheme, because each bit of the n-bit bus signals is different at logic 0 potential (for it is not the real ground potential), an alternate sense-amplifier is applied to sense and amplify the bus signals.

SUMMARY OF THE INVENTION

An object of the present invention is to provide a charge-redistribution low-swing differential logic circuit. This circuit combines a differential logic network and a charge-redistribution circuit so as to provide a pair of complementary signals having only a small difference, thereby avoiding a time delay. Further, after a sense-amplifier is used to amplify the signals, the resulting signals are then outputted to a differential logic network, wherein the output swing can be reduced by a threshold voltage $V_{tn}$ ($V_{tp}$) on a transistor. In addition, a pipeline is formed by a series connection structure controlled by a true-single-phase clock or by a pseudo-single-phase clock, thereby achieving a designed circuit having high-speed and low power dissipation.

The present invention provides a charge-redistribution low-swing differential logic circuit comprising: a charge-redistribution circuit including a first CMOS transistor and a second CMOS transistor, each coupled to a first potential terminal, wherein the gates of two CMOS transistors are coupled together to receive a clock pulse which is used to control the first and second CMOS transistors, thereby outputting a first complementary signal pair; a differential logic network having a first train of a plurality of nodes and a second train of a plurality of nodes, each train being respectively coupled between one of the first complementary signal pair and a second potential terminal, wherein one of the first complementary signal pair performs the charge-redistribution with one of the two trains of a plurality of nodes, and there is an input voltage difference between the first and second potential; a sense amplifier, coupled between the first and second potential, which is controlled by the clock pulse to sense and amplify the voltage difference of the first complementary signal pair, then to output a second complementary signal pair; and a precharge circuit, controlled by the clock pulse, and used by the sense amplifier before sensing for precharging terminals of the second complementary signal pair to a third potential with a value between the first and second potential.

The present invention provides another charge-redistribution low-swing differential logic circuit comprising: a charge-redistribution circuit, including a first transistor pair with a first common gate node connected to a clock, and a second transistor pair with a second common gate node connected to a complementary signal of the clock, wherein, the first transistor pair, coupled in series between a first potential and the second transistor pair, is controlled by the clock, and the second transistor pair is controlled by the complementary signal for outputting a first complementary signal pair; a differential logic network having a first train of a plurality of nodes and a second train of a plurality of nodes, each train being respectively coupled between one of the first complementary signal pair and a second potential, wherein one of the first complementary signal pair performs the charge-redistribution with one of the two trains, and there is a voltage difference between the first and second potential; a sense amplifier, coupled between the first and second potential, which is controlled by the clock to sense and amplify the voltage difference of the first complementary signal pair, then to output a second complementary signal pair; and a precharge circuit, controlled by the clock, and used by the sense amplifier before sensing for precharging terminals of the second complementary signal pair to a third potential that is between the first and second potential.

The present invention will become more fully understood from the detailed description given hereinbelow and the accompanying drawings, given by way of illustration only and thus not intended to be limited of the present invention.

DETAILED DESCRIPTION OF THE PREFERRED EMBODIMENT

Figure 1:
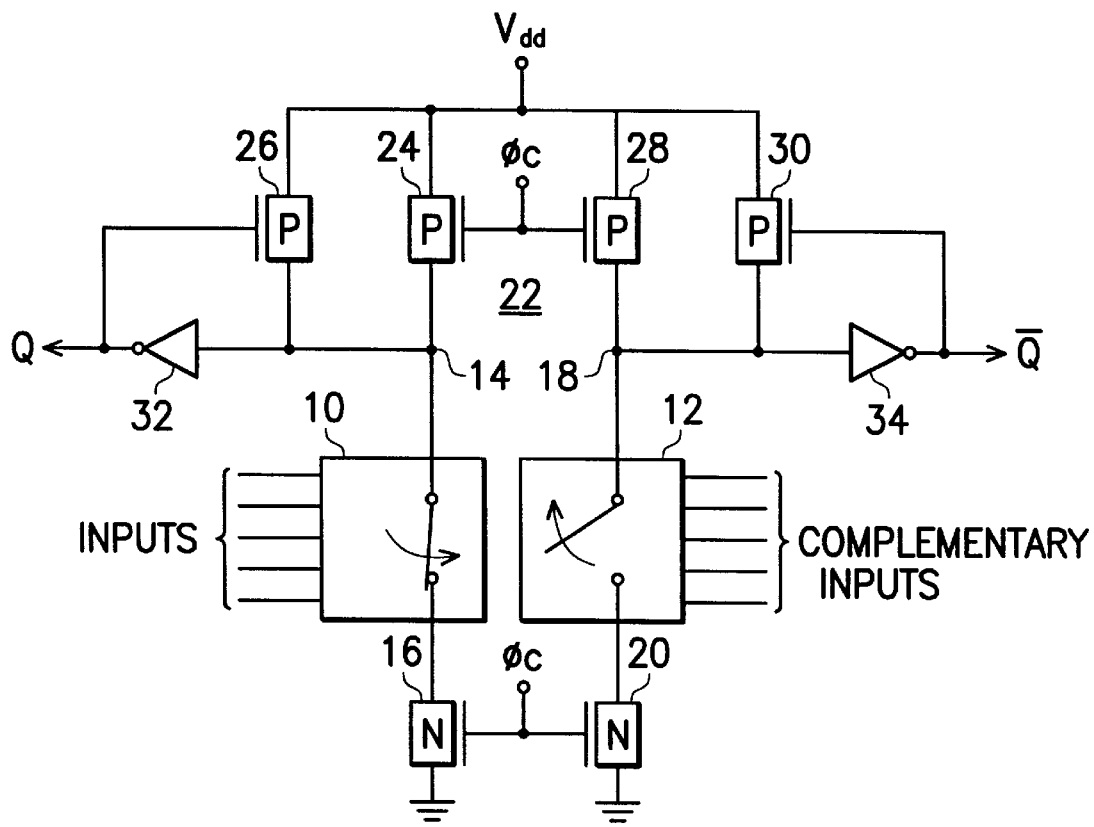
FIG. 1 illustrates A block diagram of a conventional differential logic system.

For easy description, the same reference numerals in drawings indicate the same elements. The present invention assumes that a first potential indicates a power potential and a second potential indicates a ground potential. In addition, a third potential has a value between the first and second potential.

Figure 7A:
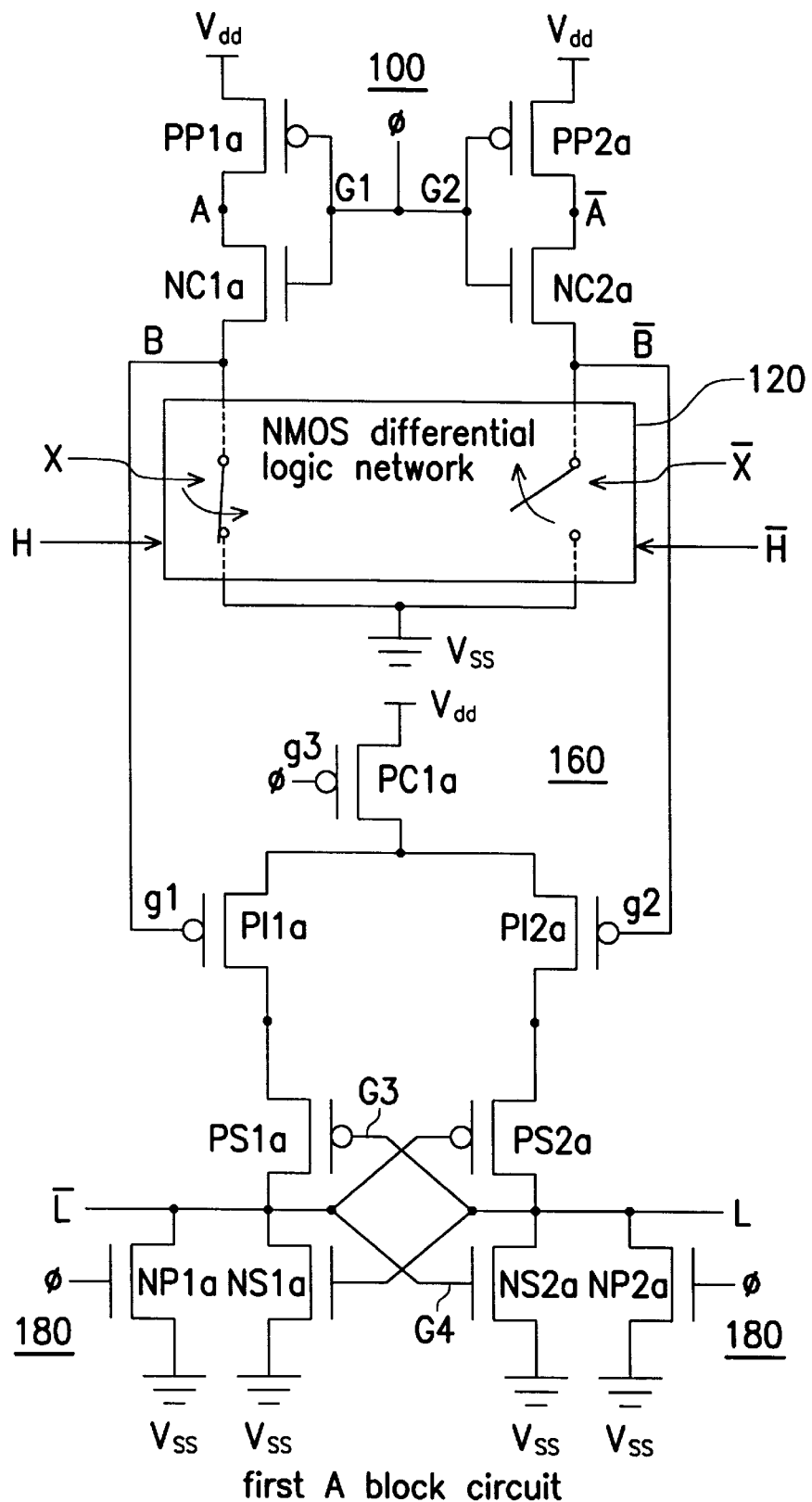
FIG. 7A is a schematic diagram of a first A block circuit illustrating a charge-redistribution low-swing differential logic circuit of the present invention.
Figure 7B:
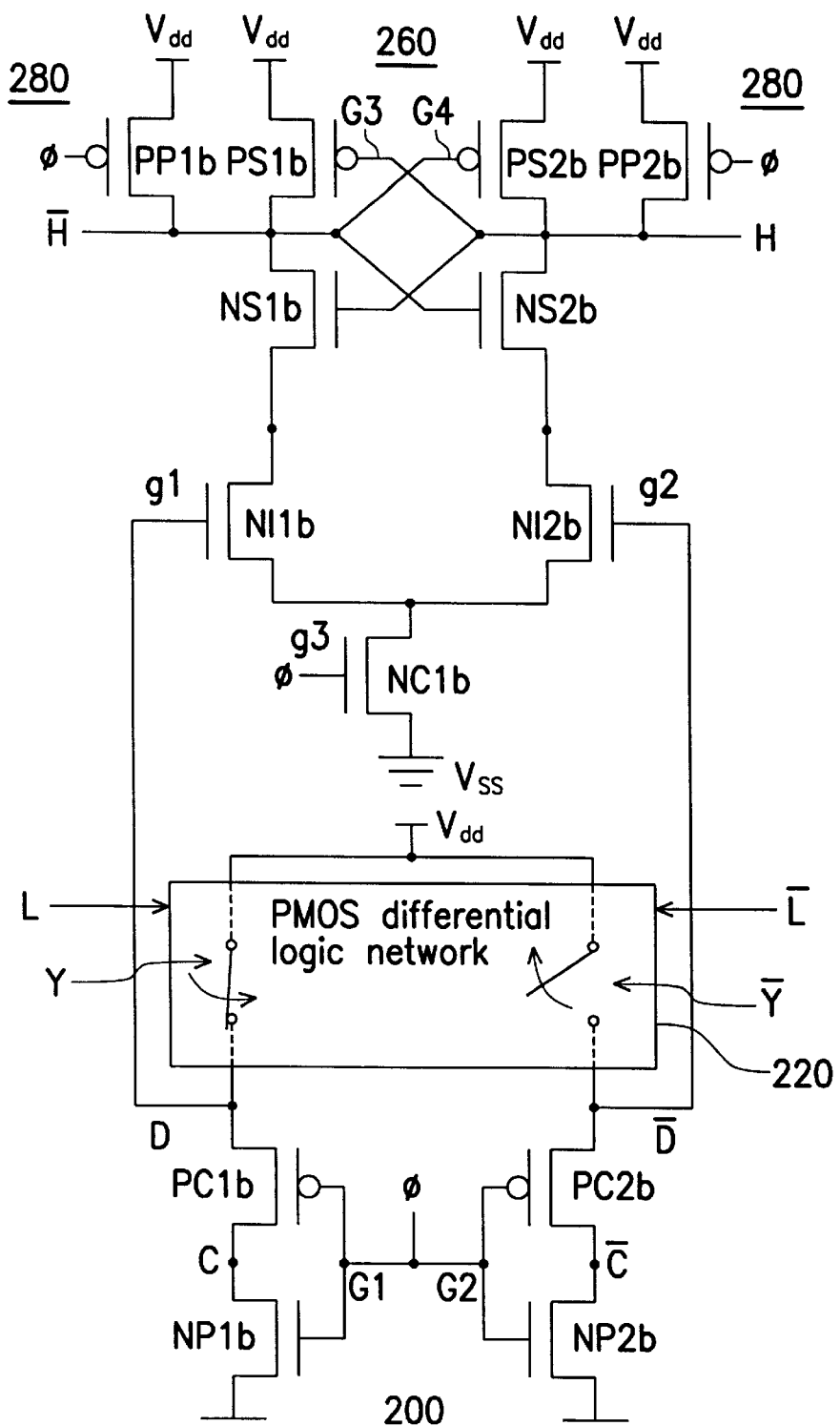
FIG. 7B is a schematic diagram of a first B block circuit illustrating the charge-redistribution low-swing differential logic circuit of the present invention.
Figure 7C:
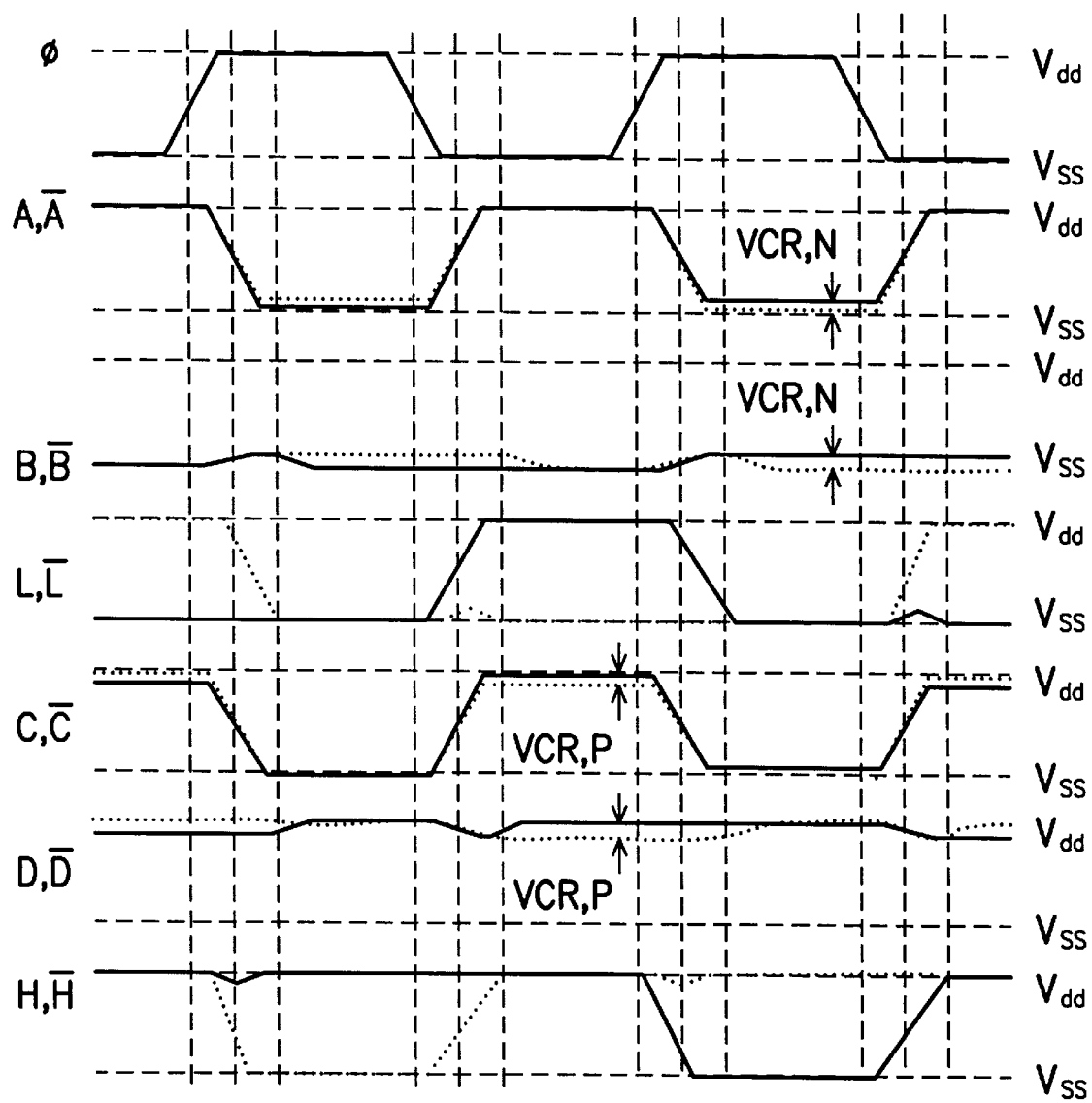
FIG. 7C illustrates timing charts of the operation in the charge-redistribution low-swing differential logic circuit of FIGS. 7A and 7B.
Figure 7D:
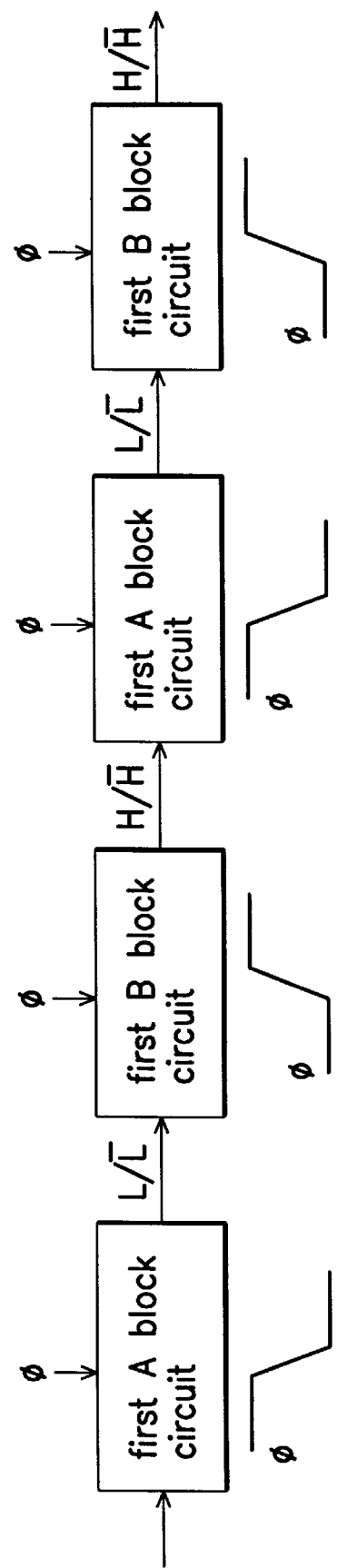
FIG. 7D illustrates schematic block diagrams of the charge-redistribution low-swing differential logic circuit of FIGS. 7A and 7B in series connection structure controlled by a true-single-phase clock.

Charge-redistribution low-swing differential logic circuits of the present invention are illustrated in FIGS. 7A and 7B, wherein FIGS. 7A, 7B illustrate first A and B block circuits, respectively. Also, FIG. 7C illustrates timing charts of the operation in FIGS. 7A, 7B, and FIG. 7D illustrates the blocks in a series connection structure controlled by a true-single-phase clock.

First, referring to FIG. 7A, the A block circuit comprising: a charge-redistribution circuit 100, a NMOS differential logic network 120, a sense-amplifier 160, and a precharge circuit 180.

The charge-redistribution circuit 100 has a CMOS transistor including a PMOS transistor PP1$a$ and a NMOS transistor NC1$a$, both coupled in series and having a common gate input G1, and another CMOS transistor including a PMOS transistor PP2$a$ and a NMOS transistor NC2$a$, both coupled in series and having a common gate input G2, wherein the two PMOS transistors PP1$a$, PP2$a$ are coupled in series between source Vdd and the NMOS transistors NC1$a$, NC2$a$, respectively, and the common gate inputs G1, G2 are coupled together to receive a true-single-phase clock $\phi$.

The NMOS differential logic network 120 is coupled between the NMOS transistors NC1$a$, NC2$a$ and ground Vss.

Figure 2A:
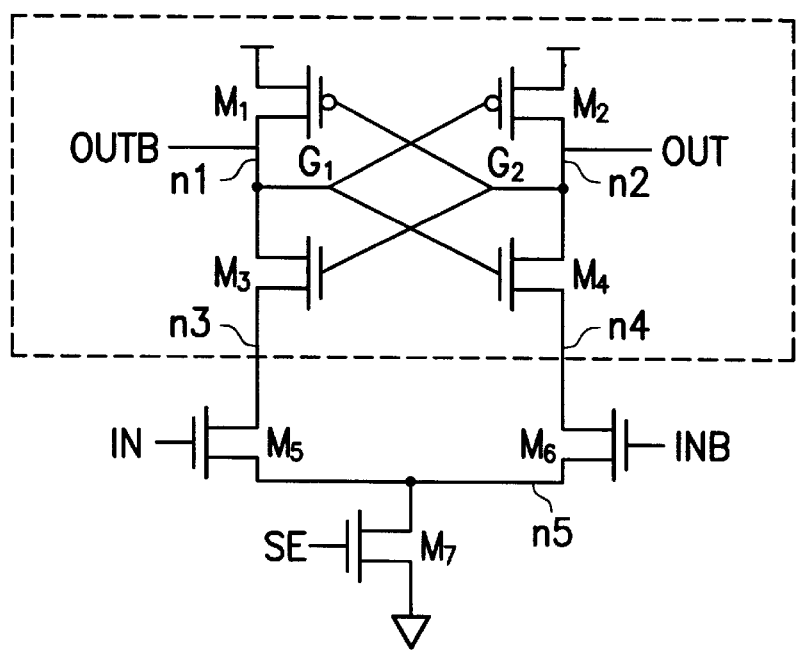
FIGS. 2A–2B illustrate A block diagram of a conventional sense-amplifier circuit.
Figure 2B:
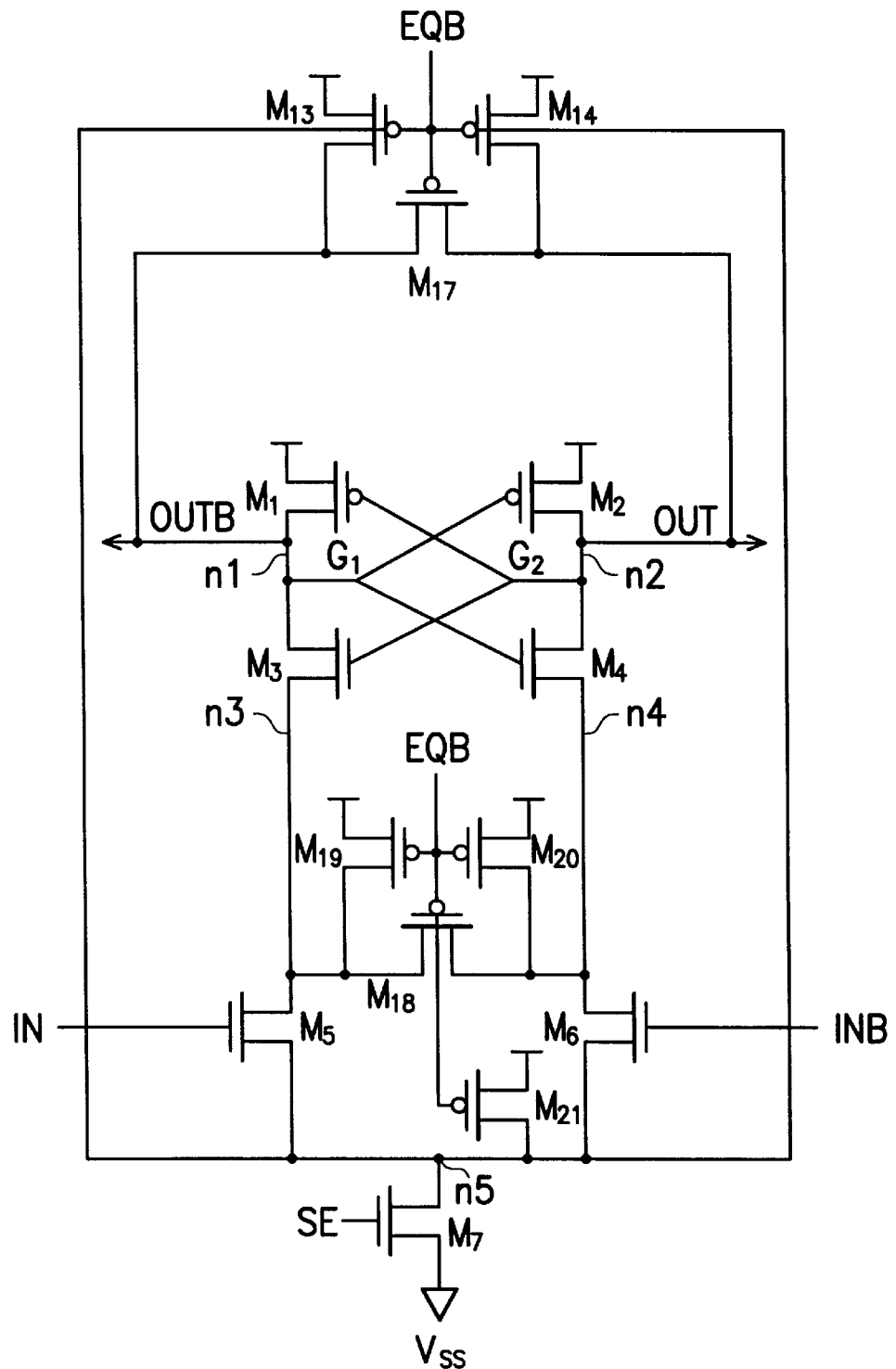

Furthermore, because a full-swing output signal is necessary, the same sense amplifier in FIG. 2A is adapted for the use of a low voltage operation. The sense-amplifier 160 includes sub-elements described as follows: a pair of sensing PMOS transistors PI1$a$, PI2$a$, a pull-up PMOS transistor PC1$a$, and two CMOS transistors. The pair of sensing PMOS transistors PI1$a$, PI2$a$ have gate inputs g1, g2, respectively. Gate inputs g1, 92 are coupled in series between the NMOS transistors NC1$a$, NC2$a$ and the NMOS differential logic network 120, respectively. A pull-up PMOS transistor PC1a is coupled in series between source Vdd and the sensing PMOS transistors PI1a, PI2a and its gate input g3 is used to receive the true-single-phase clock ϕ.

One of the CMOS transistors of the sense-amplifier 160 includes a PMOS transistor PS1a and a NMOS transistor NS1a, both coupled in series between ground Vss and the sensing PMOS transistor PI1a, thereby having a common gate input G3, and the another CMOS transistor includes a PMOS transistor PS2a and a NMOS transistor NS2a, both coupled in series between the ground Vss and the sensing PMOS transistor PI2a, thereby having a common gate input G4, wherein the two NMOS transistors NS1a, NS2a are coupled in series between ground Vss and the PMOS transistors PS1a, PS2a, respectively. In addition, the common gate input G3 is connected to a series connection node where the PMOS transistor PS2a is connected in series to the NMOS transistor NS2a, so as to output a first output L, and the common gate input G4 is connected to a series connection node where the PMOS transistor PS1a is connected in series to the NMOS transistor NS1a, so as to output a second output $\overline{L}$.

The precharge circuit 180, coupled between ground Vss and the first and second outputs L, $\overline{L}$, has a pair of precharging NMOS transistors NP1a, NP2a coupled in parallel with the NMOS transistors NS1a, NS2a, respectively.

Referring to FIG. 7B, the B block circuit comprising: a charge-redistribution circuit 200, a PMOS differential logic network 220, a sense amplifier 260, and a precharge circuit 280.

The charge-redistribution circuit 200 has a CMOS transistor including a NMOS transistor NP1b and a PMOS transistor PC1b, both coupled in series and thereby having a common gate input G1, and another CMOS transistor including a NMOS transistor NP2b and a PMOS transistor PC2b, both coupled in series and thereby having a common gate input G2, wherein two NMOS transistors NP1b, NP2b are coupled in series between ground Vss and the PMOS transistors PC1b, PC2b, respectively, and the common gate inputs G1, G2 are coupled together to receive a true-single-phase clock $\overline{\phi}$.

The PMOS differential logic network 220 is coupled between the PMOS transistors PC1b, PC2b and source Vdd.

Furthermore, because a full-swing output signal is necessary, the same sense amplifier in FIG. 2A is adapted for the use of a low voltage operation. The sense-amplifier 260 includes sub-elements described as follows: a pair of sensing NMOS transistors NI1b, NI2b, a pull-down NMOS transistor NC1b, and two CMOS transistors. The pair of sensing NMOS transistors NI1b, NI2b have gate inputs g1, g2, respectively. Gate inputs g1, g2 are coupled in series between the PMOS transistors PC1b, PC2b and the NMOS differential logic network 220, respectively. The pull-down NMOS transistor NC1b is coupled in series between ground Vss and the sensing NMOS transistors NI1b, NI2b and its gate input g3 is used to receive the true-single-phase clock ϕ.

One of the CMOS transistors of the sense-amplifier 260 includes an NMOS transistor NS1b and a PMOS transistor PS1b, both coupled in series between ground Vss and the sensing NMOS transistor NI1b, thereby having a common gate input G3, and the other CMOS transistor includes a NMOS transistor NS2b and a PMOS transistor PS2b, both coupled in series between source Vdd and the sensing NMOS transistor NI2b, thereby having a common gate input G4, wherein two PMOS transistors PS1b, PS2b are coupled in series between source Vdd and the NMOS transistors NS1b, NS2b, respectively. In addition, the common gate input G3 is connected to a series connection node where the NMOS transistor NS2b is connected in series to the PMOS transistor PS2b, so as to output a first output H, and the common gate input G4 is connected to a series connection node where the NMOS transistor NS1b is connected in series to the PMOS transistor PS1b, so as to output a second output $\overline{H}$.

The precharge circuit 280, coupled between source Vdd and the first and second outputs H, $\overline{H}$, has a pair of precharging PMOS transistors PP1b, PP2b coupled in parallel with the PMOS transistors PS1b, PS2b, respectively.

Referring to FIG. 7D, both the first A or B block circuits are controlled by a true-single-phase clock ϕ. For example, when the true-single-phase clock ϕ transits from logic 1 to logic 0, the sense-amplifier 160 of the first A block circuit is active and outputs an amplified complementary signal pair L, $\overline{L}$ to the PMOS differential logic network 220 of the first B block circuit. At this time, the full swing is the value from ground Vss to source Vdd. Likewise, when the true-single-phase clock ϕ transits from logic 0 to logic 1, the sense-amplifier 260 of the first B block circuit is active and outputs an amplified complementary signal pair H, $\overline{H}$ to the NMOS differential logic network 120 of the first A block circuit. At this time, the full swing is the value from source Vdd to ground Vss.

Timing of the present invention is illustrated in FIG. 7C. When the true-single-phase clock ϕ is pulled up from logic 0 to logic 1, the first B block circuit outputs the signal pair H, $\overline{H}$, to the next first A block circuit. On the contrary, when the true-single-phase clock ϕ is pulled down from logic 1 to logic 0, the first A block circuit outputs the signal pair L, $\overline{L}$ to the next first B block circuit. Both are described in detail as follows.

(1) First, when the true-single-phase clock ϕ is pulled up from logic 0 to logic 1, the first B block circuit outputs the signal pair H, $\overline{H}$, to the next first A block circuit.

When the true-single-phase clock ϕ is at logic 0 potential, in the first A block circuit, nodes A, $\overline{A}$ are precharged to the first potential level, i.e., to the source Vdd level, while the PMOS transistors PP1a, PP2a are active. In the first B block circuit, output nodes H, $\overline{H}$, are precharged to the source Vdd level while the PMOS transistors PP1b, PP2b are active. Therefore, the NMOS differential logic network 120 in the first A block circuit is active, therefore a plurality of internal nodes X, $\overline{X}$ of the NMOS differential logic network 120 and nodes B, $\overline{B}$ are discharged to the second potential level, i.e., to the ground Vss level.

When the true-single-phase clock ϕ is pulled up from logic 0 to logic 1, in the first B block circuit, the sense-amplifier 260 is active so as to turn off the PMOS transistors PP1b, PP2b. Therefore, the complementary signal pair on output nodes H, $\overline{H}$, are amplified and outputted to the NMOS differential logic network 120 in the first A block circuit. Here, assume that output node $\overline{H}$ is pulled down to the ground Vss level.

When the true-single-phase clock ϕ is on logic 1 potential, in the first A block circuit (FIG.7A), nodes A, $\overline{A}$ and B, $\overline{B}$, and a plurality of internal nodes X, $\overline{X}$ of the NMOS differential logic network 120 are electrically connected respectively while the NMOS transistors NC1a, NC2a are active. Because output nodes H, $\overline{H}$, connected to the NMOS differential logic network 120 output a pair of complementary signals (such as in a situation that output node H maintains on the source potential Vdd while output node $\overline{H}$ in the first B block circuit is pulled down to the ground potential Vss), in both sides of internal nodes X, $\overline{X}$ of the NMOS differential logic network 120, only one of both sides is active at a time. Nodes A, B, and X are equal to zero (i.e., node A=B=X=0) if left node X is active. For node $\overline{B}$ and a portion of internal node $\overline{X}$ of the NMOS differential logic network 120 are not connected to the ground Vss, the charge on node $\overline{A}$ is distributed onto node $\overline{B}$ and a portion of internal node $\overline{X}$ of the NMOS differential logic network 120. Assume that the voltage difference (swing) between nodes A, $\overline{A}$ is VCR,N, capacitance C1 on node $\overline{A}$ and capacitance C2 on both of node $\overline{B}$ and a portion of internal node $\overline{X}$ of the NMOS differential logic network 120. In addition, the charge conservation equation is:

$$C1 \times Vdd = (C1+C2) \times VCR,N$$

Therefore VCR,N=[C1/(C1+C2)]×Vdd

According to the equation, in a complicated NMOS differential logic network 120, C2 is much greater than C1 (i.e., C2>>C1) so as to achieve a voltage difference between nodes A, $\overline{A}$ that is slight but sufficient to be sensed by the sense amplifier, and thus to avoid sequentially sensing time delay.

(2) Second, when the true-single-phase clock $\phi$ is pulled down from logic 1 to logic 0, the first A block circuit outputs the signal pair L, $\overline{L}$ to the next first B block circuit.

When the true-single-phase clock $\phi$ is at logic 1 potential, outputs L, $\overline{L}$ of the first A block circuit are pre-discharged to the second potential level, i.e., to the ground Vss level, while the NMOS transistors PP1a, PP2a of the precharge circuit 180 are active.

When the true-single-phase clock $\phi$ is pulled down from logic 1 to logic 0, in the first B block circuit (FIG. 7B), the sense-amplifier 160 is active so as to turn off the NMOS transistors NP1a, NP2a. Therefore, the complementary signal pair on output nodes L, $\overline{L}$ are amplified and outputted to the NMOS differential logic network 220 in the first B block circuit. Assume that output node L is pulled up to the source Vdd level.

When the true-single-phase clock $\phi$ is on logic 0 potential, in the first B block circuit, nodes C, $\overline{C}$ and D, $\overline{D}$ and a plurality of internal nodes Y, $\overline{Y}$ of the NMOS differential logic network 220 are electrically connected respectively while the PMOS transistors PC1b, PC2b are active. Because output nodes L, $\overline{L}$ connected to the PMOS differential logic network 220 output a pair of complementary signals (i.e., in a condition that output node $\overline{L}$ maintains on the ground potential Vss while output node L in the first A block circuit is pulled up to the source potential Vdd), on both sides of internal nodes Y, $\overline{Y}$ of the PMOS differential logic network 220, only one of both sides is active at a time. Nodes C, D, and Y are equal to Vdd (i.e., node C=D=Y=Vdd) if left node Y is active. For node $\overline{D}$ and a portion of internal node $\overline{Y}$ of the PMOS differential logic network 220 are not connected to the source Vdd, the charge on node is distributed onto node $\overline{D}$ and a portion of internal node $\overline{Y}$ of the PMOS differential logic network 220. Assume that the voltage difference (swing) between nodes C, $\overline{C}$ is VCR,P, capacitance C3 on node $\overline{C}$ and capacitance C4 on both of node $\overline{D}$ and a portion of internal node $\overline{Y}$ of the PMOS differential logic network 220. In addition, the charge conservation equation is:

$$C3 \times Vdd = (C3+C4) \times VCR,P$$

Therefore VCR,P=[C3/(C3+C4)]×Vdd

According to this equation, complicated PMOS differential logic network 220, C4 is much greater than C3 (i.e., C4>>C3) so as to achieve a voltage difference between nodes C, $\overline{C}$ that is slight but sufficient to be sensed by the sense amplifier, and thus to avoid sequentially sensing time delay.

Figure 8A:
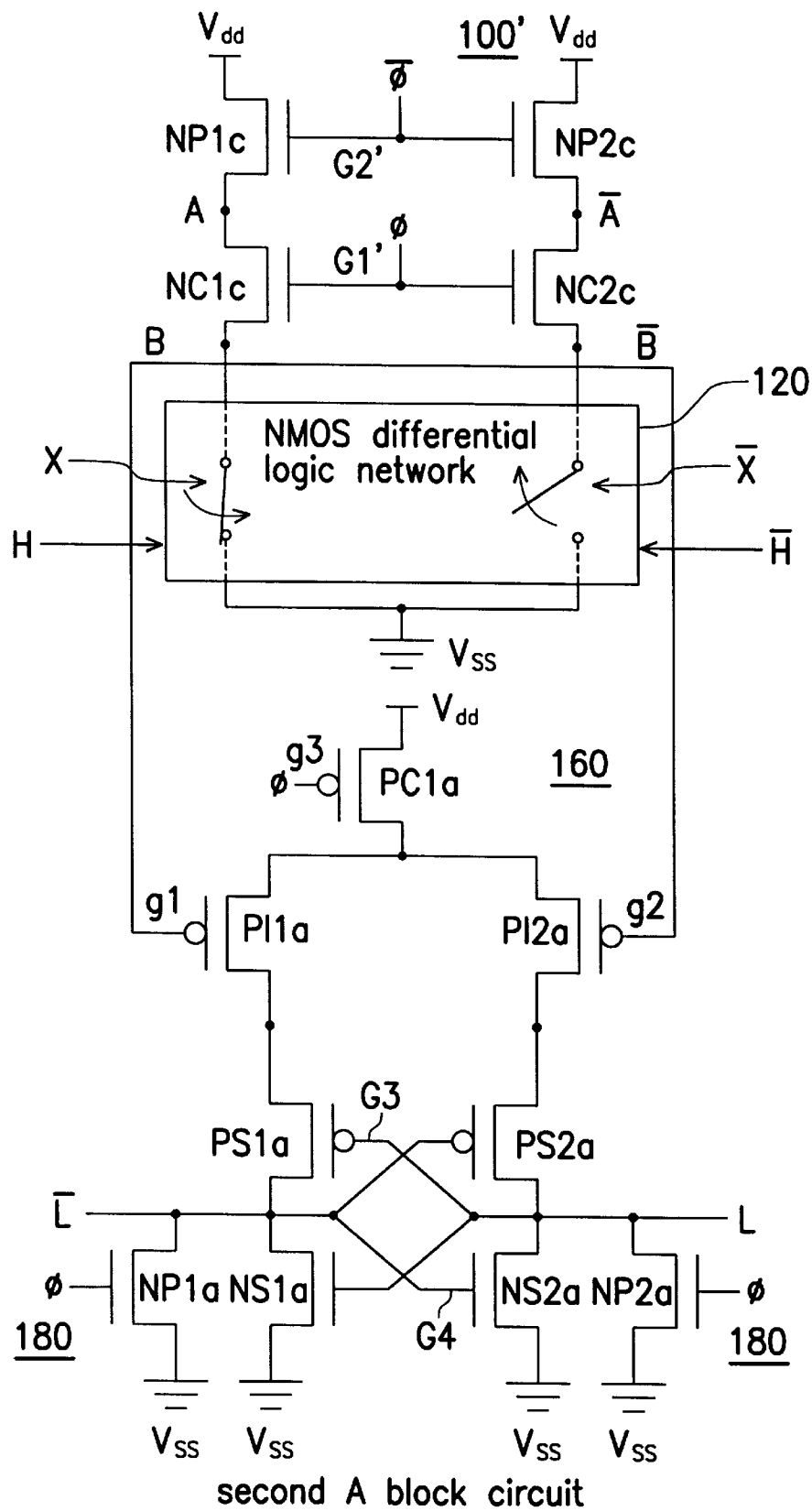
FIG. 8A is a schematic diagram of a second A block circuit illustrating the charge-redistribution low-swing differential logic circuit of the present invention.
Figure 8B:
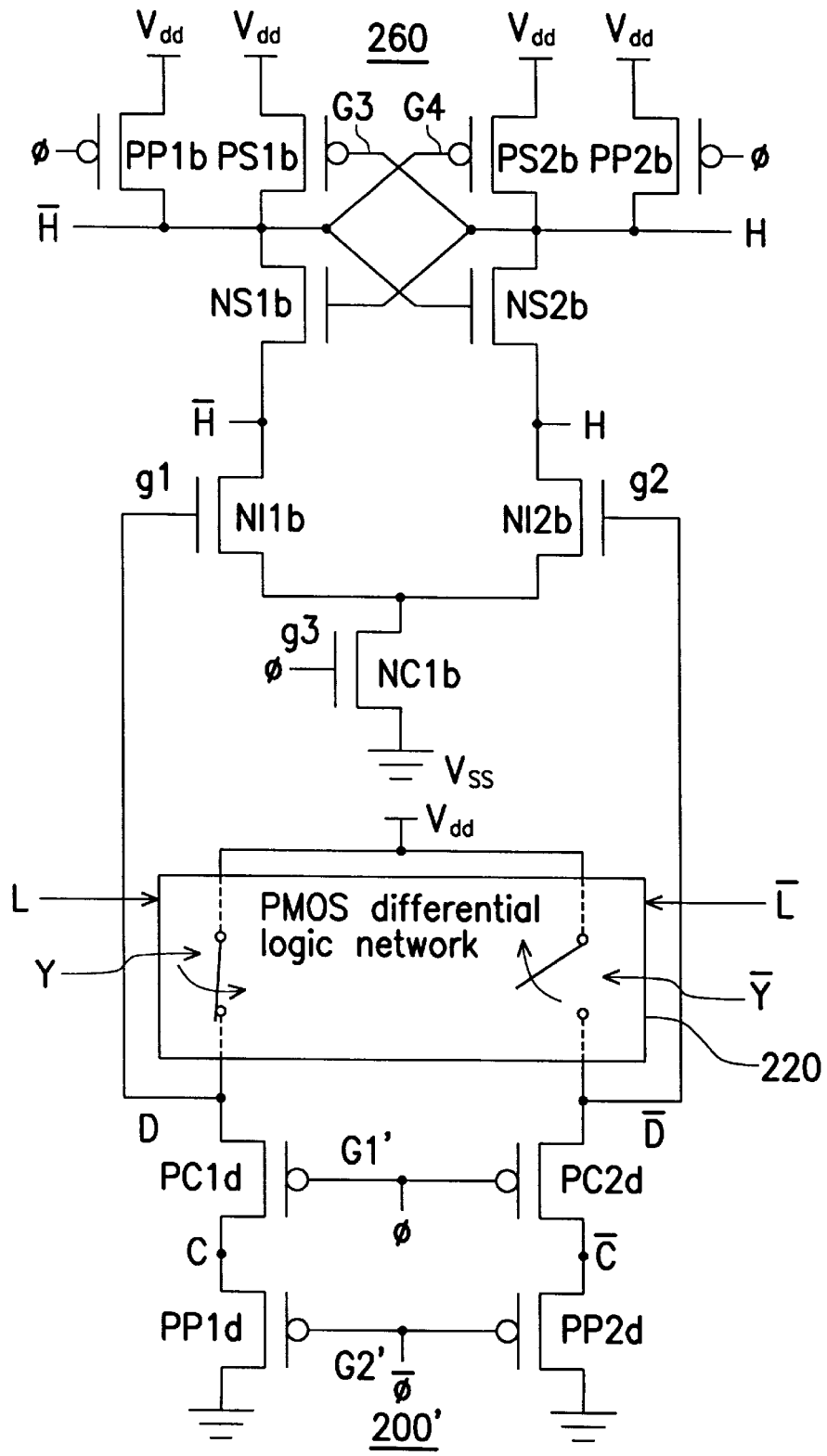
FIG. 8B is a schematic diagram of a second B block circuit illustrating the charge-redistribution low-swing differential logic circuit of the present invention.

Charge-redistribution low-swing differential logic circuits are illustrated as follows in FIGS. 8A to 8B, wherein FIG. 8A illustrates a second A block circuit and FIG. 8B illustrates a second B block circuit. In the circuit of 8A, the charge-redistribution circuit 100 of the first A block circuit is replaced with charge-redistribution circuit 100' to simplify the layout design. The circuit 100' includes two NMOS inverters, wherein one of two NMOS inverters is formed by NMOS transistors NP1c, NC1c coupled in series, and the other of two NMOS inverters is formed by NMOS transistors NP2c, NC2c coupled in series. In addition, transistors NP1c, NP2c are coupled in series between source Vdd and transistors NC1c, NC2c, respectively. Transistors NC1c, NC2c have a common gate input G1' to receive a true-single-phase clock $\phi$, and transistors NP1c, NP2c have a common gate input G2' to receive a complementary clock $\overline{\phi}$.

The layout design for the above can be easily made by replacing PMOS transistors PP1a, PP2a of FIG. 7A with NMOS transistors NP1c, NP2c of FIG. 8A. Therefore, node A (or $\overline{A}$) is precharged only to a third potential, i.e., a difference Vdd–Vtn (not source voltage) between source voltage Vdd and threshold voltage Vtn (about 0.7 Volts) of NMOS transistor (NP1c,NP2c), which can reduce the power dissipation.

Similarly, in the second B block circuit of 8B, the charge-redistribution circuit 200 of the first B block circuit of FIG. 7B is replaced with charge-redistribution circuit 200' to simplify the layout design. The circuit 200' includes two PMOS inverters, wherein one of two PMOS inverters is formed by PMOS transistors PP1d, PC1d coupled in series, and the other of two PMOS inverters is formed by PMOS transistors PP2d, PC2d coupled in series. In addition, transistors PP1d, PP2d are coupled in series between ground Vss and transistors PC1d, PC2d, respectively. Transistors PC1d, PC2d have a common gate input G1' to receive the true-single-phase clock $\phi$, and transistors PP1d, PP2d have a common gate input G2' to receive the complementary clock $\overline{\phi}$.

The layout design for the above is easily made by replacing NMOS transistors NP1b, NP2b of FIG. 7B with PMOS transistors PP1d, PP2d in FIG. 8B. Therefore, node C (or $\overline{C}$) is pre-discharged only to a third potential, i.e., threshold voltage |Vtp| of PMOS transistor (PP1d,PP2d) (not ground voltage), which can reduce the power dissipation.

Figure 9A:
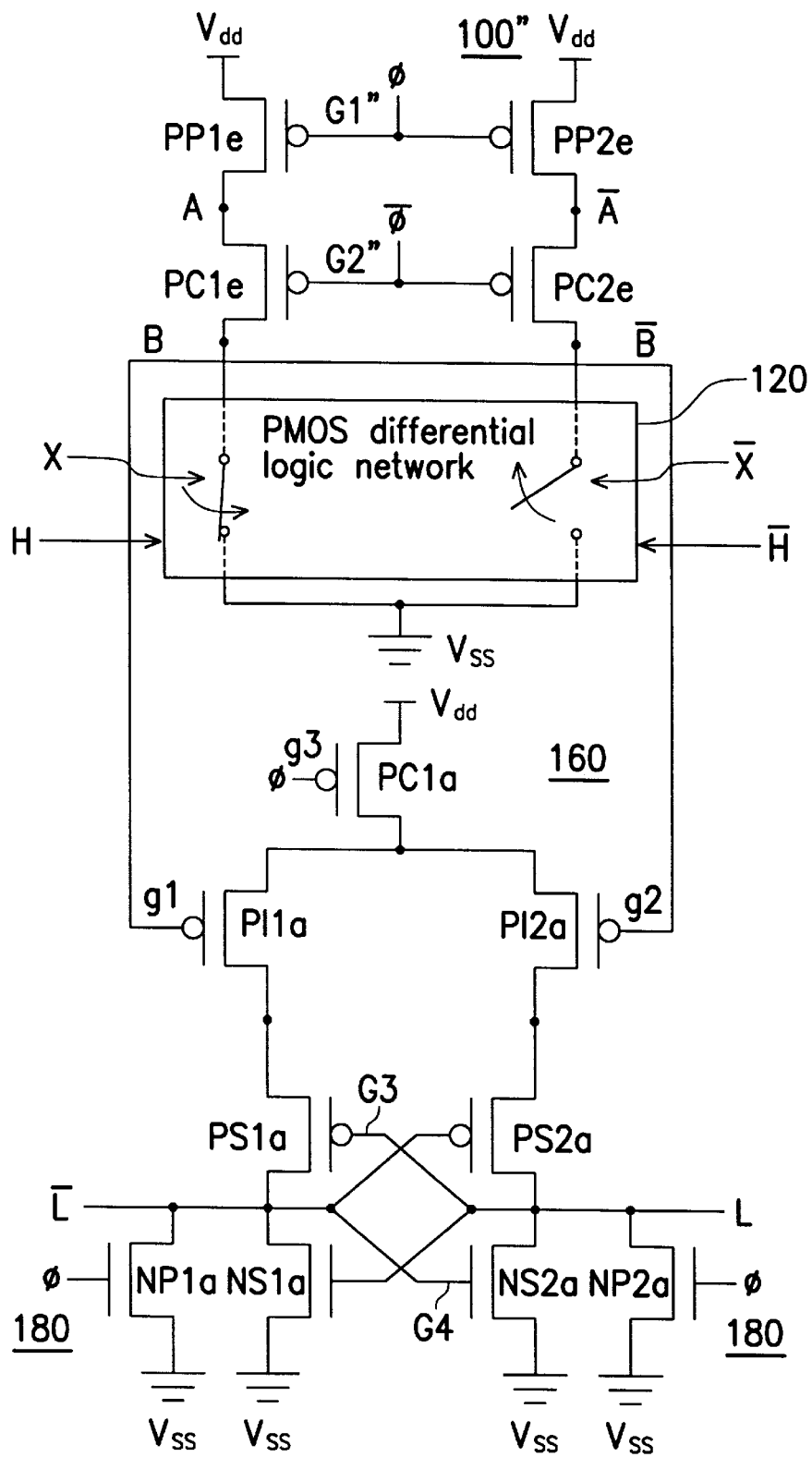
FIG. 9A is a schematic diagram of a third A block circuit illustrating the charge-redistribution low-swing differential logic circuit of the present invention.
Figure 9B:
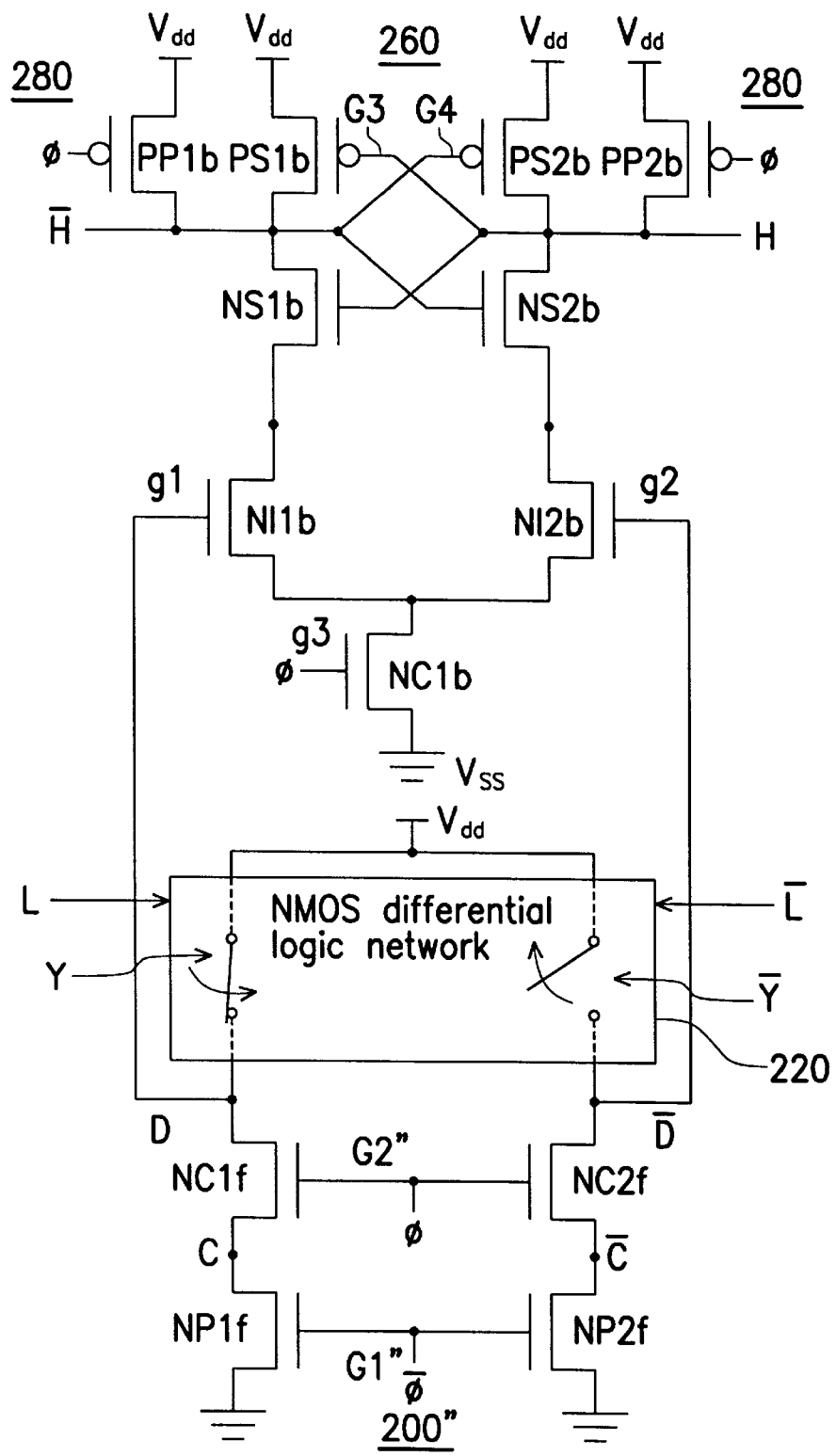
FIG. 9B is a schematic diagram of a third B block circuit illustrating the charge-redistribution low-swing differential logic circuit of the present invention.

Charge-redistribution low-swing differential logic circuits of the present invention are illustrated as following in FIGS. 9A to 9B. FIGS. 9A, 9B illustrate a third A and B block circuits, respectively. The difference between FIG. 7A and 9A is that the charge-redistribution circuit 100 of the first A block circuit is replaced with charge-redistribution circuit 100" to simplify the layout design. The circuit 100" includes two PMOS inverters, wherein one of two PMOS inverters is formed by PMOS transistors PP1e, PC1e coupled in series, and the other of two PMOS inverters is formed by PMOS transistors PP2e, PC2e coupled in series. In addition, transistors PP1e, PP2e are coupled in series between source Vdd and transistors PC1e, PC2e. Transistors PP1e, PP2e have a common gate input G1" to receive the true-single-phase clock $\phi$, and transistors PC1e, PC2e have a common gate input G2" to receive the complementary clock $\overline{\phi}$.

The layout design for the above is easily made by replacing NMOS transistors NC1a, NC2a in FIG. 7A with PMOS transistors PC1e, PC2e in FIG. 9A. Therefore, node A (or $\overline{A}$) is precharged to the first voltage potential, i.e., the source voltage Vdd, hence, the potential is pulled down only to the third potential, i.e., the voltage potential |Vtp| (PC1e, PC2e) when the true-single-phase clock φ is pulled down from logic 1 to logic 0, which can reduce the power dissipation.

Similarly, the difference between FIGS. 9B and 7B is that the charge-redistribution circuit 200 of the first B block circuit is replaced with charge-redistribution circuit 200" to simplify the layout design. Circuit 200" includes two NMOS inverters, wherein one of two NMOS inverters is formed by NMOS transistors NP1f, NC1f coupled in series, and the other of two NMOS inverters is formed by NMOS transistors NP2f, NC2f coupled in series. In addition, transistors NP1f, NP2f are coupled in series between ground Vss and transistors NC1f, NC2f. Transistors P1f, NP2f have a common gate input G1" to receive the true-single-phase clock φ, and Transistors NC1f, NC2f have a common gate input G2" to receive the complementary clock $\overline{φ}$.

The layout design for the above is easily made by replacing PMOS transistors PC1b, PC2b in FIG. 7B with NMOS transistors NC1f, NC2f in FIG. 9B. Therefore, node $\overline{C}$ (or C) is precharged to the source voltage Vdd, hence, the potential of node $\overline{C}$ (or C) is pulled up only to the third potential Vdd−Vtn (NC1f, NC2f) when the true-single-phase clock φ is pulled up from logic 0 to logic 1, which can reduce the power dissipation.

Figure 3A:
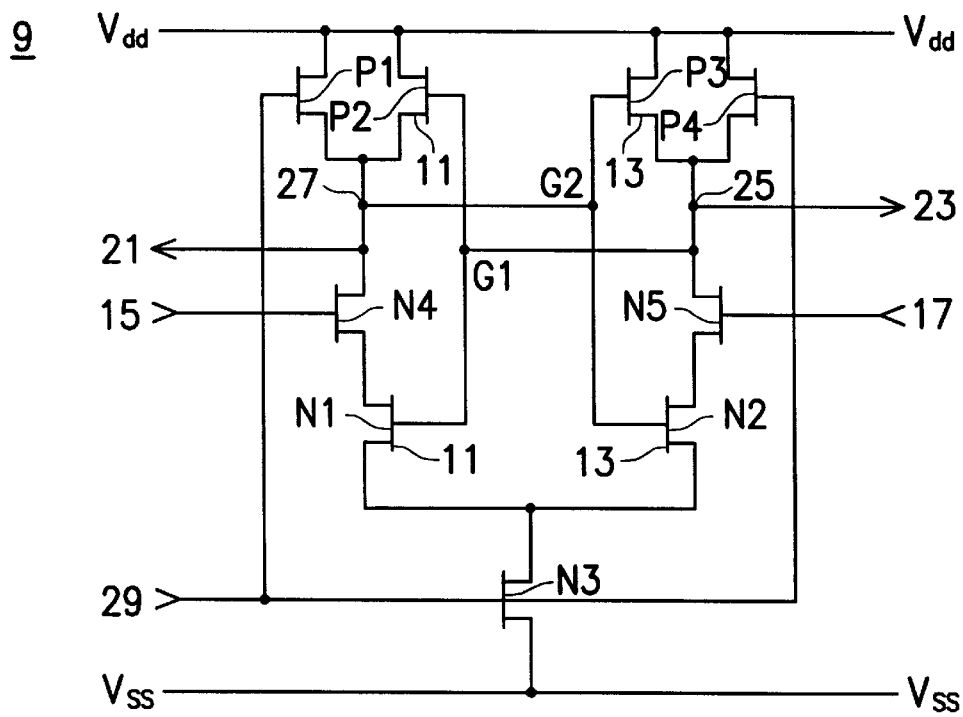
FIGS. 3A–3B illustrate A block diagram of another conventional sense-amplifier circuit.
Figure 3B:
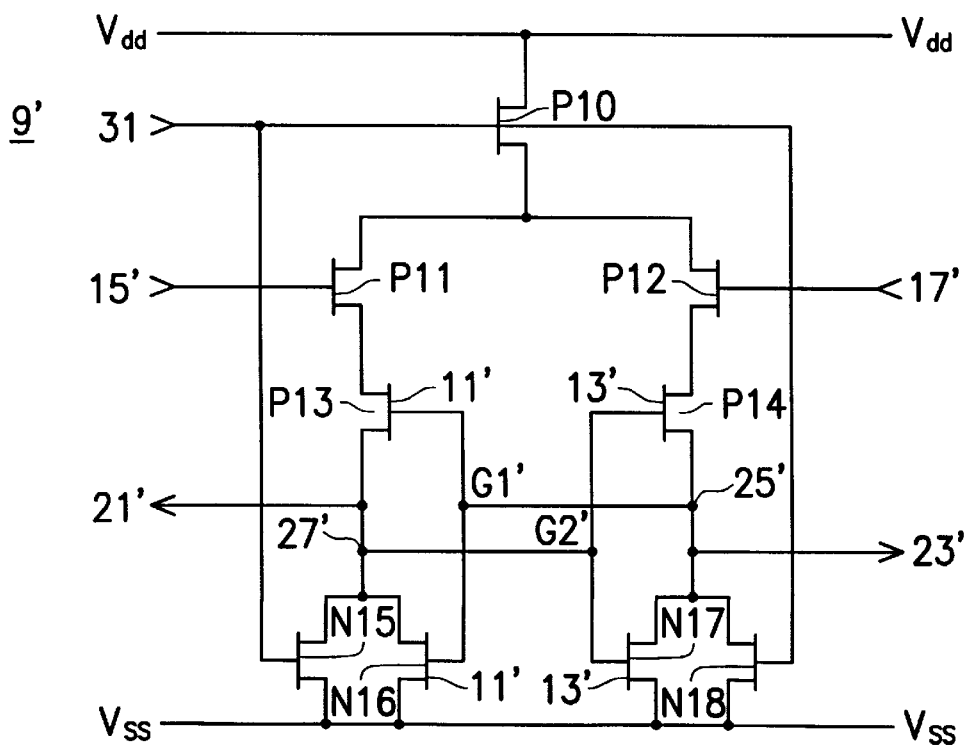
Figure 4A:
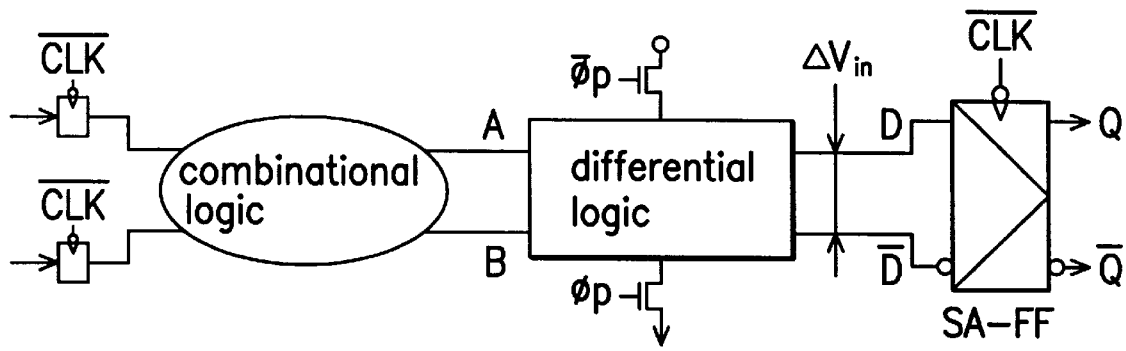
FIG. 4A illustrates A block diagram of a circuit typically combining a NMOS differential logic system and a sense-amplifier.
Figure 4B:
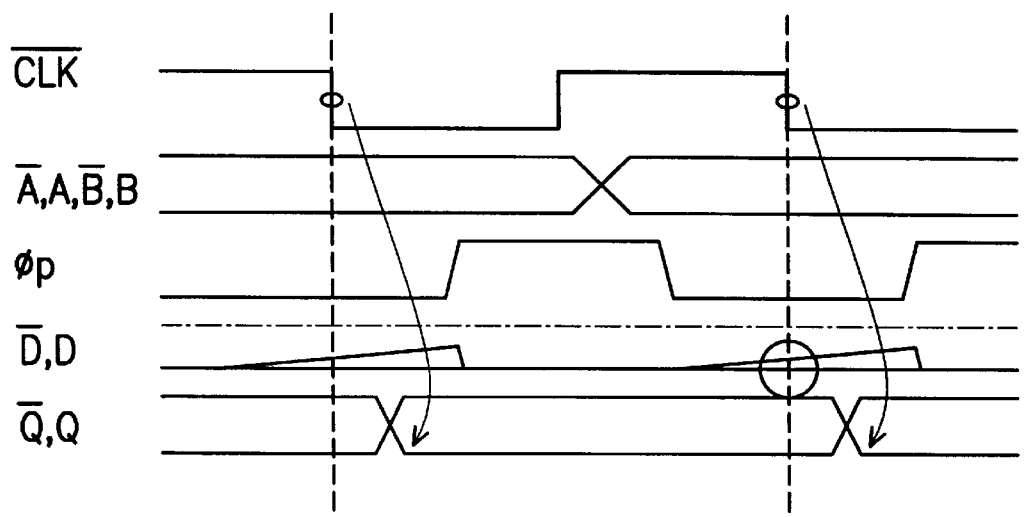
FIG. 4B illustrates timing charts of the operation in FIG. 4A.
Figure 5:
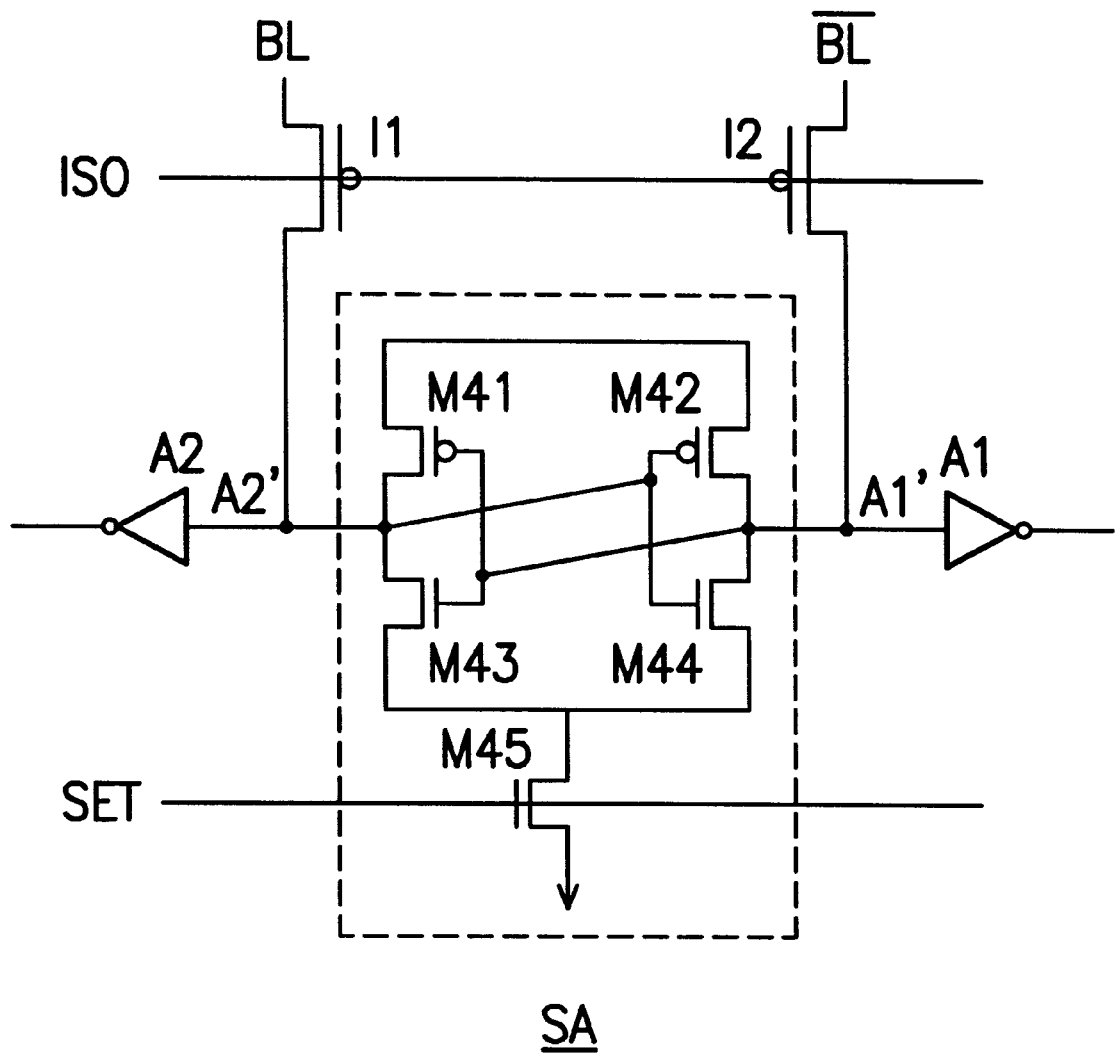
FIG. 5 illustrates A block diagram of a conventional sense-amplifier circuit with isolated transistors.
Figure 6A:
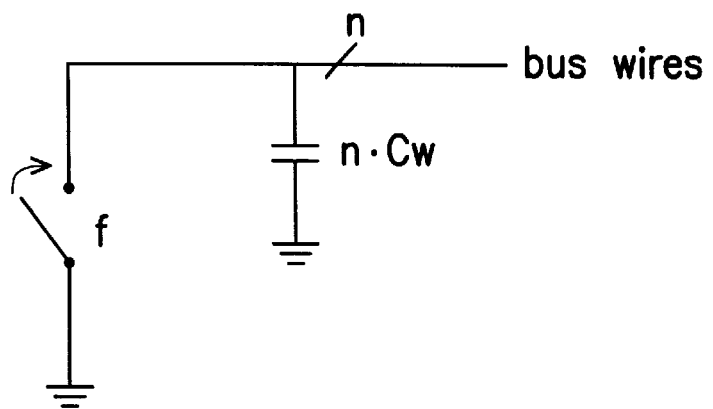
FIG. 6A illustrates a schematic diagram of a conventional n-bit bus wire circuit with true ground.
Figure 6B:
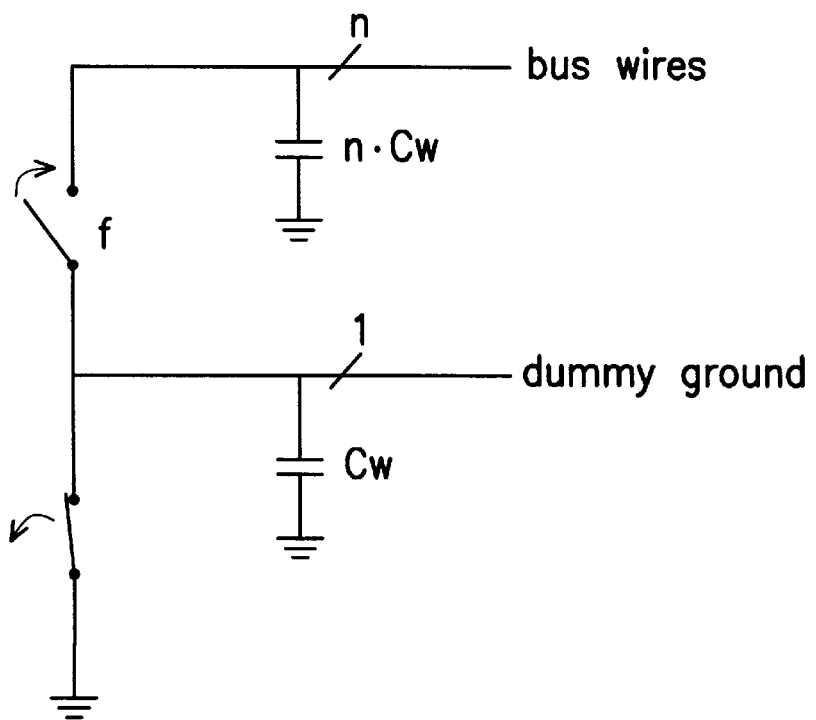
FIG. 6B illustrates a schematic diagram of a conventional n-bit bus wire circuit with dummy ground.
Figure 10A:
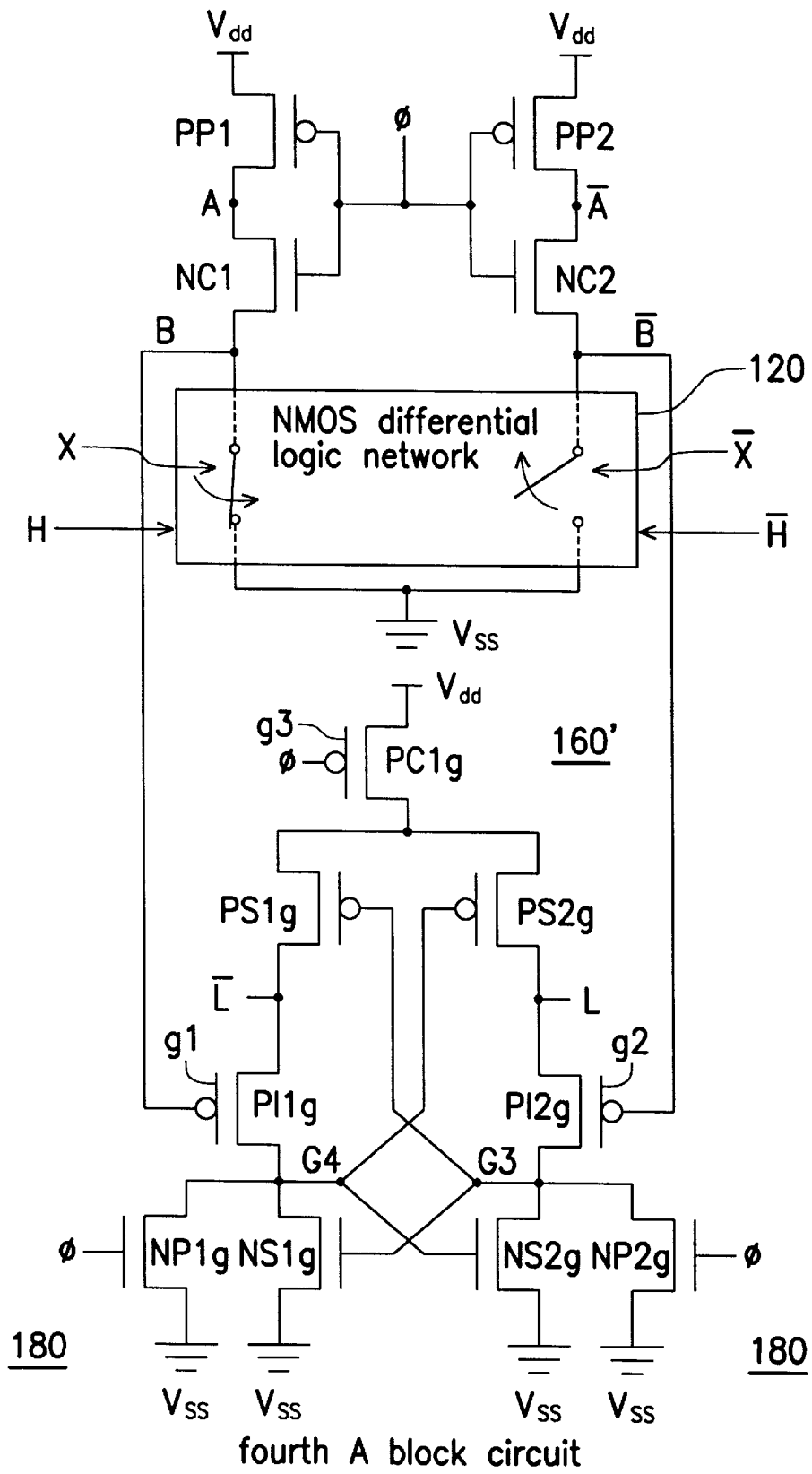
FIG. 10A is a schematic diagram of a fourth A block circuit illustrating the charge-redistribution low-swing differential logic circuit of the present invention.
Figure 10B:
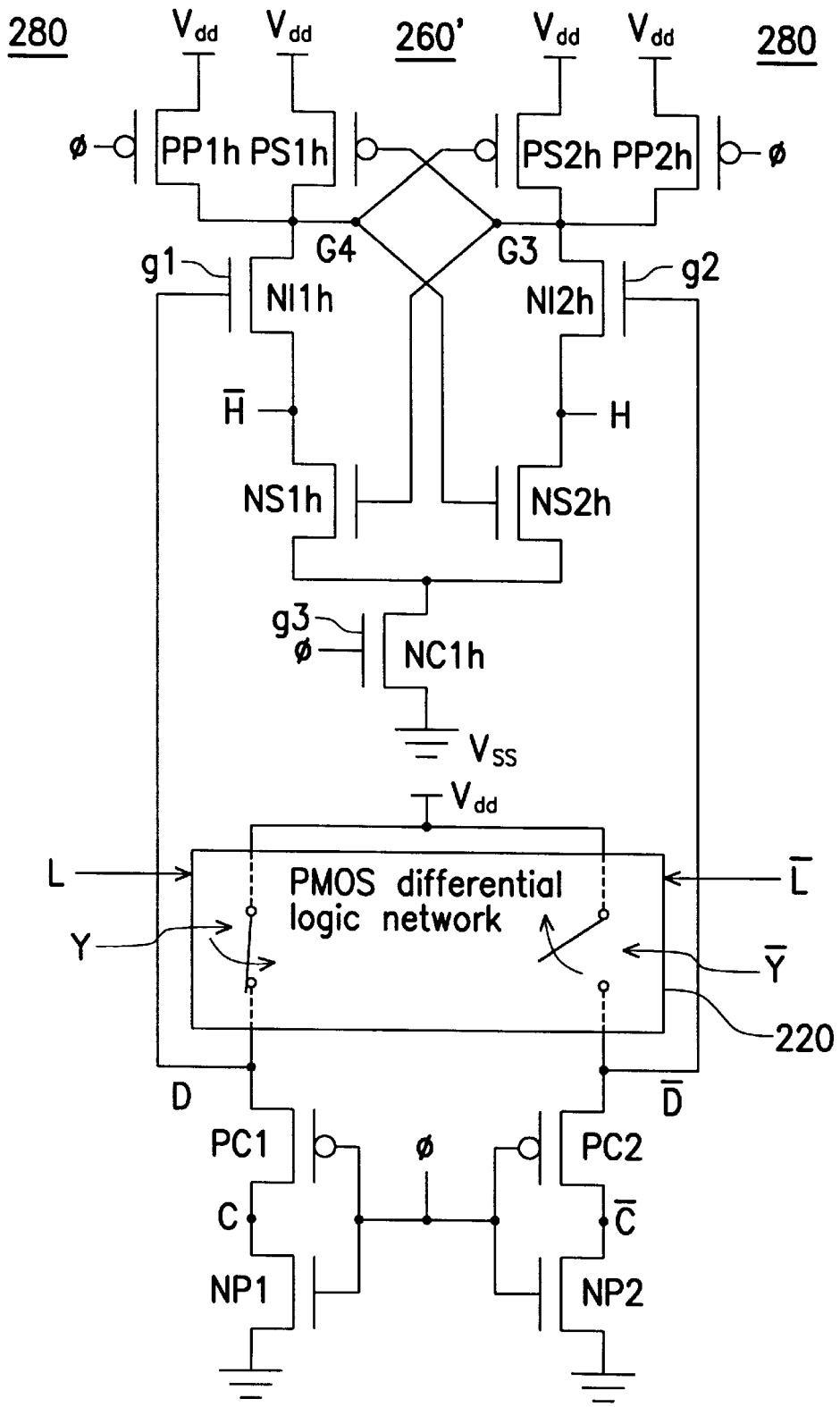
FIG. 10B is a schematic diagram of a fourth B block circuit illustrating the charge-redistribution low-swing differential logic circuit of the present invention.

Charge-redistribution low-swing differential logic circuits are illustrated as following in FIGS. 10A to 10B. FIGS. 10A, 10B illustrate fourth A and B block circuits, respectively. The difference between FIGS. 10A and 7A is that the sense amplifier 160 of the first A block circuit of FIG. 7A is replaced with sense-amplifier 160', so to create the fourth A block circuit. Sense amplifier 160', adapted for the configuration in FIG. 3B, is formed by following elements: two CMOS transistors, a pair of sensing PMOS transistors PI1g, PI2g, a pull-up PMOS transistor PC1g, and a precharge circuit 180. The difference between the sense-amplifier 160' in FIG. 10A and the configuration in FIG. 3B is the output node.

One of the CMOS transistors is comprised of coupling a PMOS transistor PS1g and a NMOS transistor NS1g in series and thereby having a common gate input G3, and the other CMOS transistor is comprised of coupling a PMOS transistor PS2g and a NMOS transistor NS2g in series and thereby having a common gate input G4.

The pair of sensing PMOS transistors PI1g, PI2g have gate inputs g1, g2, respectively. The NMOS transistors NS1g, NS2g are coupled in series between ground Vss and the sensing PMOS transistors PI1g, PI2g, respectively. And the gate inputs g1, g2 are coupled in series between the NMOS transistors NC1, NC2 and the NMOS differential logic network 120, respectively.

The pull-up PMOS transistor PC1g is coupled in series between source Vdd and the sensing PMOS transistors PI1g, PI2g and its gate input g3 is used to receive true-single-phase clock φ. In addition, a series connection node where the PMOS transistor PS2g is connected to the PMOS transistor PI2g, is used for a first output $\overline{L}$ of sense amplifier 160', and another series connection node where the PMOS transistor PS1g is connected to the PMOS transistor PI1g, is used for a second output L of sense amplifier 160'.

The precharge circuit 180, coupled in parallel with the NMOS transistors NS1g, NS2g, has a pair of precharging NMOS transistors NP1g, NP2g coupled between ground Vss and the sensing PMOS transistors PI1g, PI2g, respectively, and its gate inputs are used to receive the true-single-phase clock φ.

Similarly, the difference between FIGS. 10B and 7B is that the sense amplifier 260 of the first B block circuit of FIG. 7B is replaced with sense-amplifier 260', so to create the fourth B block circuit. Sense amplifier 260', adapted for the configuration in FIG. 3A, is formed by following elements: two CMOS transistors, a pair of sensing NMOS transistors NI1h, NI2h, a pull-down NMOS transistor NC1h, and a precharge circuit 280. The difference between the sense-amplifier 260' in FIG. 10B and the configuration in FIG. 3A is the output node.

One of the CMOS transistors comprises a NMOS transistor NS1h and a PMOS transistor PS1h coupled in series and thereby having a common gate input G3, and the other CMOS transistor comprises a NMOS transistor NS2h and a PMOS transistor PS2h coupled in series and thereby having a common gate input G4.

The pair of sensing NMOS transistors NI1h, NI2h have gate inputs g1, g2, respectively. The PMOS transistors PS1h, PS2h are coupled in series between source Vdd and the sensing NMOS transistors NI1h, NI2h, respectively. And gate inputs g1, g2 are coupled in series between the PMOS transistors PC1h, PC2h and the PMOS differential logic network 220, respectively.

The pull-down NMOS transistor NC1h is coupled in series between ground Vss and the sensing NMOS transistors NS1h, NS2h and gate input g3 is used to receive the true-single-phase clock φ. In addition, a series connection node where the NMOS transistor NS2h is connected to the NMOS transistor NI2h, is used for a first output H of sense amplifier 260', and another series connection node where the NMOS transistor NS1h is connected to the NMOS transistor NI1h is used for a second output $\overline{H}$ of sense amplifier 260'.

The precharge circuit 280, coupled in parallel with the PMOS transistors PS1h, PS2h, has a pair of precharging PMOS transistors PP1h, PP2h coupled between source Vdd and the sensing NMOS transistors NI1h, NI2h, respectively, and its gate inputs are used to receive the true-single-phase clock φ.

Figure 10C:
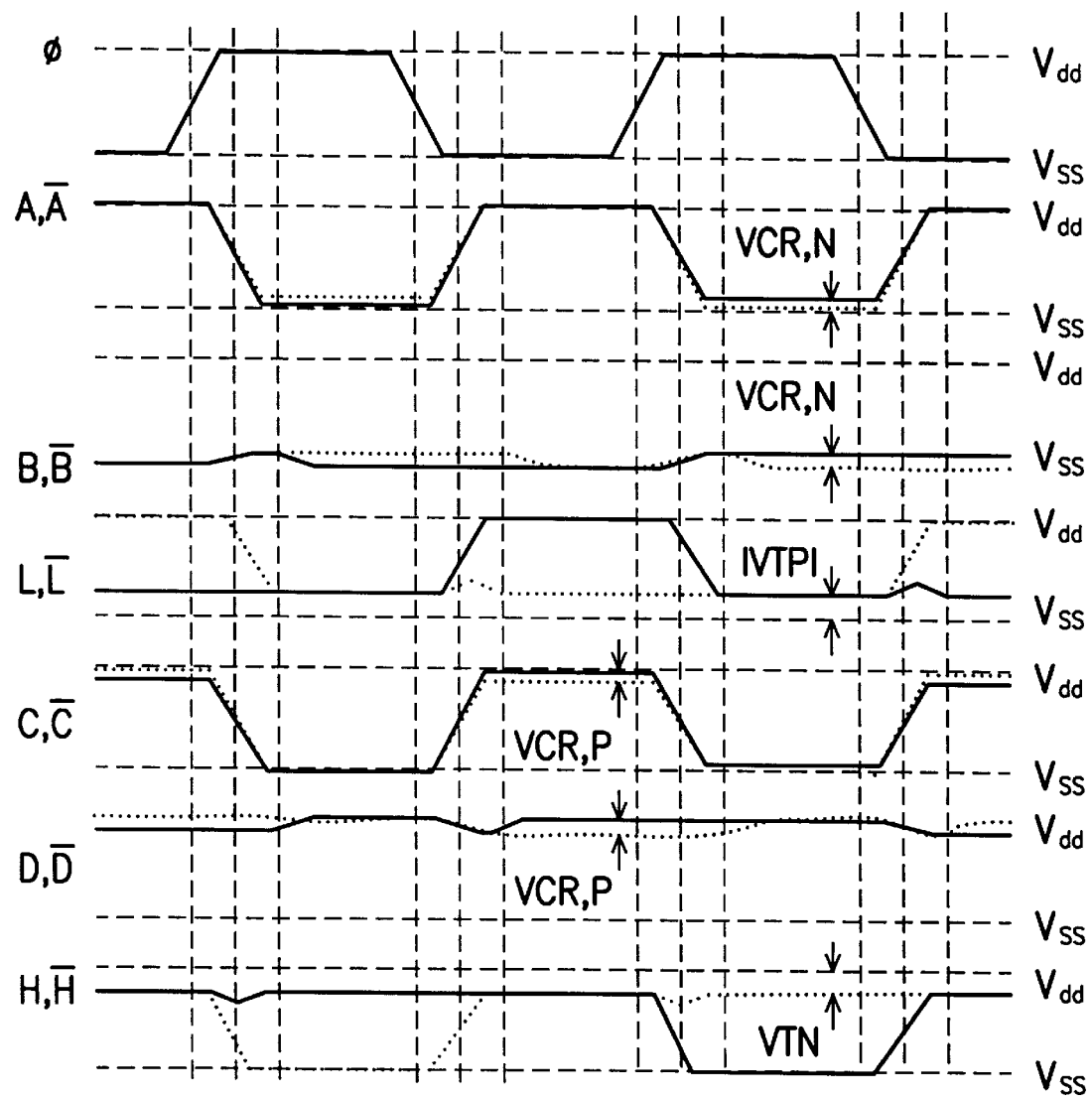
FIG. 10C illustrates timing charts of the operation in the charge-redistribution low-swing differential logic circuit of FIGS. 10A and 10B.
Figure 10D:
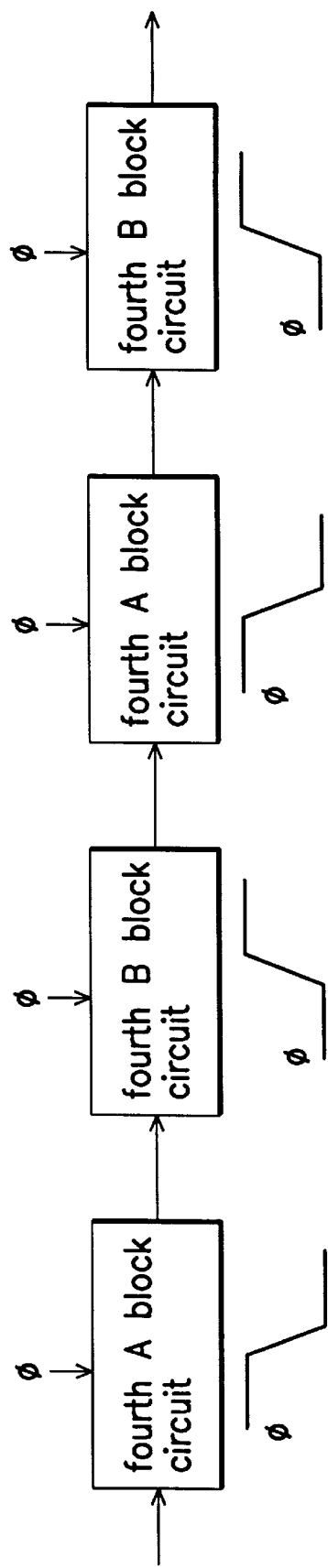
FIG. 10D illustrates schematic block diagrams of the charge-redistribution low-swing differential logic circuit of FIGS. 10A and 10B in series connection structure controlled by a true-single-phase clock.

FIG. 10D illustrates a series connection structure controlled by the true-single-phase clock the same as that of FIG. 7D. Also, FIG. 10C illustrates the same operating mode as FIG. 7C except that the voltage swing of output nodes L, $\overline{L}$ in the fourth A block circuit is from source voltage Vdd to PMOS transistor threshold voltage |Vtp| but the voltage swing of output nodes H, $\overline{H}$, in the fourth B block circuit is the difference Vdd−Vtn between the Vss-Vdd and NMOS transistor threshold voltage Vtn.

Furthermore, because a full-swing output signal is necessary, the same output node of the sense-amplifier as shown in FIGS. 3A and 3B is adapted for the use of a low voltage operation.

A high-speed pipeline structure is created because the series connection structure is controlled by a true-single-phase clock in the charge-redistribution low-swing differential logic circuit.

Figure 11:
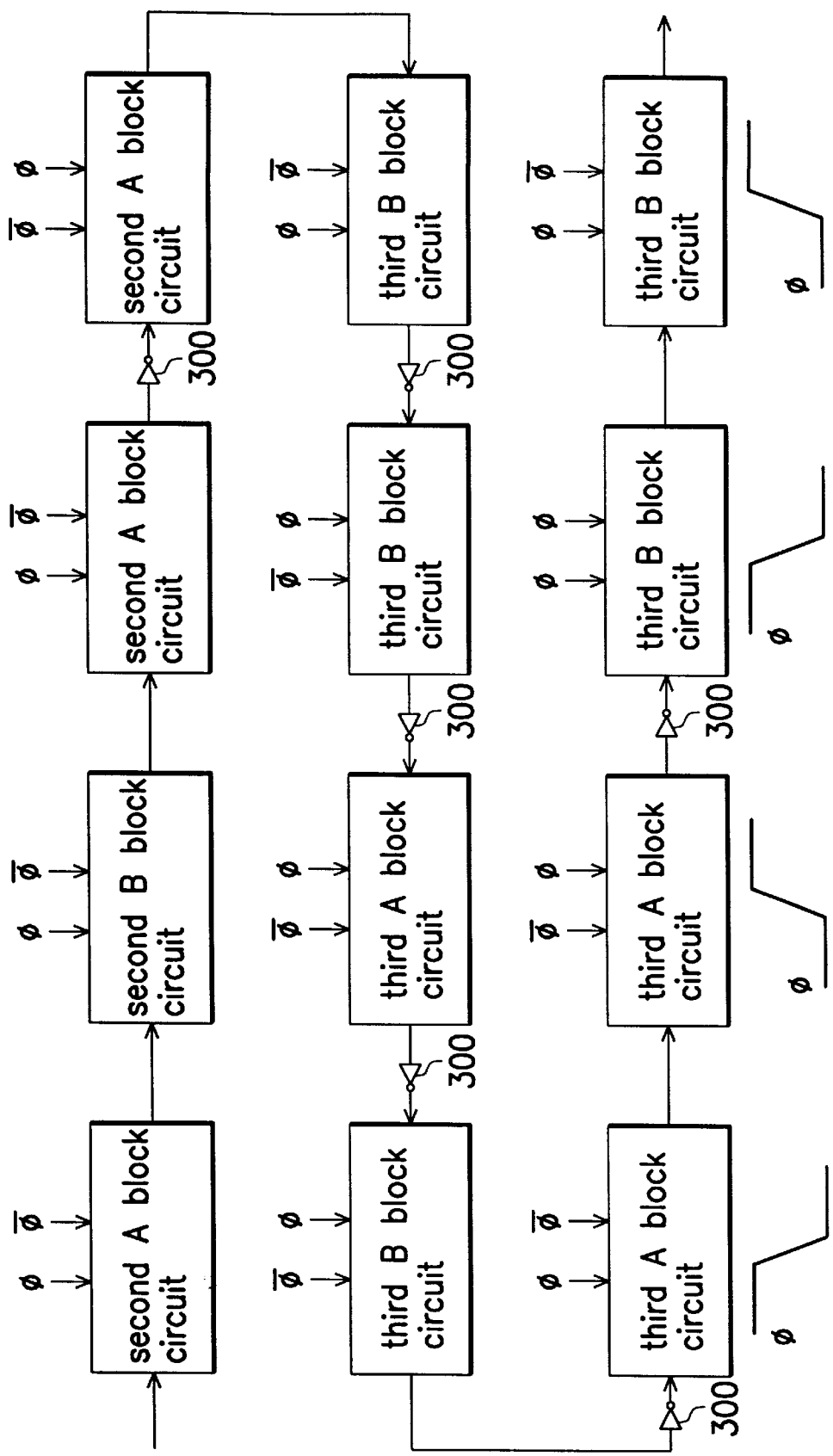
FIG. 11 illustrates schematic block diagrams of the present invention in series connection structure controlled by a pseudo-single-phase clock $\phi$, $\bar{\phi}$.

To illustrate the function of the charge-redistribution low-swing differential logic circuit of FIGS. 8A, 8B and FIGS. 9A, 9B, FIG. 11 is provided. Referring to FIG. 11, a series connection train controlled by a pseudo-single-phase clock φ, $\overline{φ}$ includes the second A block circuit in FIG. 8A, the second B block circuit in FIG. 8B, the third A block circuit in FIG. 9A, and the third B block circuit in FIG. 9B. Inverters 300 are used in the series connection structure under the conditions of A and B block connection, some different block circuit type connections, and time of clock φ, $\overline{φ}$ transition.

When different types of differential logic circuits are connected in series between each other to form a pipeline structure, the input signal for the block has to be ensured in an output state of predetermined phase so that both terminals of the next differential logic network are turned on. For example, the input signal of NMOS differential logic network has a predetermined value "1", and input signal of PMOS differential logic network has a predetermined value "0". Therefore, an inverter is added into previous output circuit to turn on the sequential circuit if the predetermined value of previous output circuit turns both terminals of sequential differential logic network off.

While the invention has been particularly shown and described with reference to preferred embodiments thereof, it will be understood by those skilled in the art that various changes in form and details may be made therein without departing from the spirit and scope of the invention.

What is claimed is:

1. A charge-redistribution low-swing differential logic circuit comprising:

a charge-redistribution circuit including a first CMOS transistor and a second CMOS transistor, each coupled to a first potential terminal, wherein the gates of two CMOS transistors are coupled together to receive a clock pulse which is used to control the first and second CMOS transistors, thereby outputting a first complementary signal pair;

a differential logic network having a first train of a plurality of nodes and a second train of a plurality of nodes, each train being respectively coupled between one of the first complementary signal pair and a second potential terminal, wherein one of the first complementary signal pair performs the charge-redistribution with one of the two trains of a plurality of nodes, and there is an input voltage difference between the first and second potential;

a sense amplifier, coupled between the first and second potential, which is controlled by the clock pulse to sense and amplify the voltage difference of the first complementary signal pair, then to output a second complementary signal pair; and a precharge circuit, controlled by the clock pulse, and used by the sense amplifier before sensing for precharging terminals of the second complementary signal pair to a third potential with a value between the first and second potential.

2. The charge-redistribution low-swing differential logic circuit as claimed in claim 1, wherein the first CMOS transistor comprises a first transistor and a second transistor connected in series, the second CMOS transistor comprises a third transistor and a fourth transistor connected in series, wherein the first and third transistors are coupled in series between the first potential and the second and fourth transistors, the four transistors have the common gate coupled to the clock, and the charge-redistribution circuit outputs the first complementary signal pair respectively through the second and fourth transistors.

3. The charge-redistribution low-swing differential logic circuit as claimed in claim 2, wherein the differential logic network is coupled in series between the second and fourth transistors and the second potential.

4. The charge-redistribution low-swing differential logic circuit as claimed in claim 1, wherein the sense amplifier comprises:

a sensing transistor pair having gates respectively connected to terminals of the first complementary signal pair, a pull transistor having a gate connected to the clock, coupled in series between the first potential and the sensing transistor pair, a third CMOS transistor having a first common gate node and a first common node of drain-to-source, and a fourth CMOS having a second common gate node and a second common node of drain-to-source, each respectively coupled in series between the second potential and one of the sensing transistor pair, wherein the first common gate node is connected to the second common node of drain-to-source to form one of the second complementary signal pair as an output of the sense amplifier, and the second common gate node is connected to the first common node of drain-to-source to form the other of the second complementary signal pair as another output of the sense amplifier.

5. The charge-redistribution low-swing differential logic circuit as claimed in claim 4, wherein the precharge circuit having gates connected to the clock comprises a precharging transistor pair coupled in series between terminals of the second complementary signal pair and the second potential.

6. The charge-redistribution low-swing differential logic circuit as claimed in claim 1, wherein the sense amplifier comprises:

a pull transistor with a gate connected to the clock, a third CMOS transistor including a first and second transistor, both transistors having a first common gate node, and a fourth CMOS transistor including a third and fourth transistor, both transistors having a second common gate node, wherein the first and third transistors are connected in series to the pull transistor, and the second and fourth transistors are connected in series to the second potential, and a sensing transistor pair having gates respectively connected to terminals of the first complementary signal pair, wherein one of the sensing transistor pair is coupled in series between the first and second transistors to form a first series connection node close to the second transistor, the other is coupled in series between the third and fourth transistors to form a second series connection node close to the fourth transistor, wherein the first series connection node is connected to the second common gate node, the second series connection node is connected to the first common gate node, and an output node pair between the sensing transistor pair and the first and third transistors is used to output a second complementary signal pair, respectively.

7. The charge-redistribution low-swing differential logic circuit as claimed in claim 6, wherein the precharge circuit having gates connected to the clock comprises a precharging transistor pair coupled in series between the first and second series connection nodes and the second potential.

8. A charge-redistribution low-swing differential logic circuit comprising:

a charge-redistribution circuit, including a first transistor pair with a first common gate node connected to a clock, and a second transistor pair with a second common gate node connected to a complementary signal of the clock, wherein, the first transistor pair, coupled in series between a first potential and the second transistor pair, is controlled by the clock, and the second transistor pair is controlled by the complementary signal for outputting a first complementary signal pair;

a differential logic network having a first train of a plurality of nodes and a second train of a plurality of nodes, each train being respectively coupled between one of the first complementary signal pair and a second potential, wherein one of the first complementary signal pair performs the charge-redistribution with one of the two trains, and there is a voltage difference between the first and second potential;

a sense amplifier, coupled between the first and second potential, which is controlled by the clock to sense and amplify the voltage difference of the first complementary signal pair, then to output a second complementary signal pair; and a precharge circuit, controlled by the clock, and used by the sense amplifier before sensing for precharging terminals of the second complementary signal pair to a third potential that is between the first and second potential.

9. The charge-redistribution low-swing differential logic circuit as claimed in claim 8, wherein the differential logic network is coupled between the second transistor pair and the second potential.

10. The charge-redistribution low-swing differential logic circuit as claimed in claim 8, wherein the sense amplifier comprises:

a sensing transistor pair having gates respectively connected to the first complementary signal pair, a pull transistor having a gate connected to the clock, coupled in series between the first potential terminal and the sensing transistor pair, a first CMOS transistor having a third common gate node and a first common node of drain-to-source, and a second CMOS transistor having a fourth common gate node and a second common node of drain-to-source, each coupled in series between the second potential and one of the sensing transistor pair, respectively, wherein the third common gate node is connected to the second common node of drain-to-source to form one of the second complementary signal pair as an output of the sense amplifier, and the fourth common gate node is connected to the first common node of drain-to-source to form the other of the second complementary signal pair as another output of the sense amplifier.

11. The charge-redistribution low-swing differential logic circuit as claimed in claim 10, wherein the precharge circuit with gates connected to the clock, comprises a precharging transistor coupled in series between the second complementary signal pair and the second potential.

12. The charge-redistribution low-swing differential logic circuit as claimed in claim 8, wherein the sense amplifier comprises:

a pull transistor with a gate coupled to the clock, a first CMOS transistor, including the first and second transistors with the third common gate node, and a second CMOS transistor, including the third and fourth transistors with the fourth common gate node, wherein the first and third transistors are connected in series with the pull transistor, and the second and fourth transistors are connected in series with the second potential, and a sensing transistor pair with gates respectively coupled to terminals of the first complementary signal pair, wherein one of the sensing transistor pair is coupled in series between the first and second transistors to form a first series connection node close to the second transistor, the other is coupled in series between the third and fourth transistors to form a second series connection ode close to the fourth transistor, wherein the first series connection node is connected to the fourth common gate node, the second series connection node is connected to the third common gate node, and an output node pair between the sensing transistor pair and the first and third transistors is used to output a second complementary signal pair, respectively.

13. The charge-redistribution low-swing differential logic circuit as claimed in claim 12, wherein the precharge circuit having a gate coupled to the clock comprises a precharging transistor pair coupled in series between the first and second series connection nodes and the second potential terminal, respectively.

14. The charge-redistribution low-swing differential logic circuit as claimed in claim 8, wherein the first potential is at the power level.

15. The charge-redistribution low-swing differential logic circuit as claimed in claim 14, wherein the second potential is at the ground level.

* * * * *